United States Patent
Satpathy et al.

(10) Patent No.: US 11,126,663 B2
(45) Date of Patent: Sep. 21, 2021

(54) METHOD AND APPARATUS FOR ENERGY EFFICIENT DECOMPRESSION USING ORDERED TOKENS

(71) Applicant: Intel Corporation, Santa Clara, CA (US)

(72) Inventors: Sudhir K. Satpathy, Hillsboro, OR (US); Vikram B. Suresh, Hillsboro, OR (US); Sanu K. Mathew, Hillsboro, OR (US); Vinodh Gopal, Westborough, MA (US)

(73) Assignee: Intel Corporation, Santa Clara, CA (US)

( * ) Notice: Subject to any disclaimer, the term of this patent is extended or adjusted under 35 U.S.C. 154(b) by 896 days.

(21) Appl. No.: 15/604,793

(22) Filed: May 25, 2017

(65) Prior Publication Data

US 2018/0341722 A1 Nov. 29, 2018

(51) Int. Cl.
*G06F 16/903* (2019.01)
*G06F 16/901* (2019.01)
*G06F 12/02* (2006.01)

(52) U.S. Cl.
CPC ...... *G06F 16/90339* (2019.01); *G06F 12/023* (2013.01); *G06F 16/9017* (2019.01); *G06F 2212/401* (2013.01)

(58) Field of Classification Search
None
See application file for complete search history.

(56) References Cited

U.S. PATENT DOCUMENTS

| | | | |
|---|---|---|---|
| 5,109,433 A | 4/1992 | Notenboom | |
| 5,655,097 A | 8/1997 | Witt et al. | |
| 5,778,219 A | 7/1998 | Amerson et al. | |
| 6,037,883 A | 3/2000 | Forbes | |
| 7,469,334 B1 | 12/2008 | Chaudhry et al. | |
| 7,765,219 B2* | 7/2010 | Ellis | G06F 16/24578 707/752 |
| 8,791,843 B2 | 7/2014 | Cohen | |
| 9,363,339 B2 | 6/2016 | Bhaskar et al. | |
| 9,513,919 B2 | 12/2016 | Satpathy et al. | |
| 9,825,647 B1 | 11/2017 | Satpathy et al. | |
| 9,825,648 B1 | 11/2017 | Gopal et al. | |
| 2002/0049861 A1* | 4/2002 | Bunn | H04L 65/607 709/247 |
| 2002/0194461 A1 | 12/2002 | Glenn et al. | |

(Continued)

OTHER PUBLICATIONS

"RFC1951—Deflate Compressed Data Format Specification version," Internet URL http://www.faqs.org/rfcs/rfc1951.html, Aug. 19, 2016, 15 pages.

(Continued)

*Primary Examiner* — Christopher J Raab
(74) *Attorney, Agent, or Firm* — Alliance IP, LLC

(57) ABSTRACT

In one embodiment, an apparatus comprises a decompression engine to determine a plurality of tokens used to encode a block of data; populate a lookup table with at least two of the tokens in order of increasing token length; disable a first portion of the lookup table and enable a second portion of the lookup table based on a value of a payload of the block of data; and search for a match between a token and the payload in the second portion of the lookup table.

23 Claims, 16 Drawing Sheets

(56) References Cited

U.S. PATENT DOCUMENTS

| | | | |
|---|---|---|---|
| 2008/0080505 A1* | 4/2008 | Munoz | H04L 45/00 370/392 |
| 2008/0266151 A1 | 10/2008 | Sankaran | |
| 2011/0213807 A1* | 9/2011 | Mattsson | H04L 63/0428 707/802 |
| 2012/0221860 A1* | 8/2012 | Hoornaert | G06F 21/34 713/172 |
| 2016/0034442 A1* | 2/2016 | Levy | H04L 63/0421 709/203 |
| 2018/0114023 A1* | 4/2018 | Bakthavatchalam | G06F 21/567 |
| 2018/0159551 A1 | 6/2018 | Gopal et al. | |
| 2019/0260388 A1* | 8/2019 | Wegener | G06F 9/3877 |

OTHER PUBLICATIONS

Huffman, D. A., "A Method for the Construction of Minimum Redundancy Codes", Proceedings of the Institute of Radio Engineers, Sep. 1952, vol. 40, No. 9, pp. 1098-1101, 4 pages.

Ziv J., Lempel A., "A Universal Algorithm for Sequential Data Compression", IEEE Transactions on Information Theory, May 1977, vol. 23, No. 3, pp. 337-343, 7 pages.

* cited by examiner

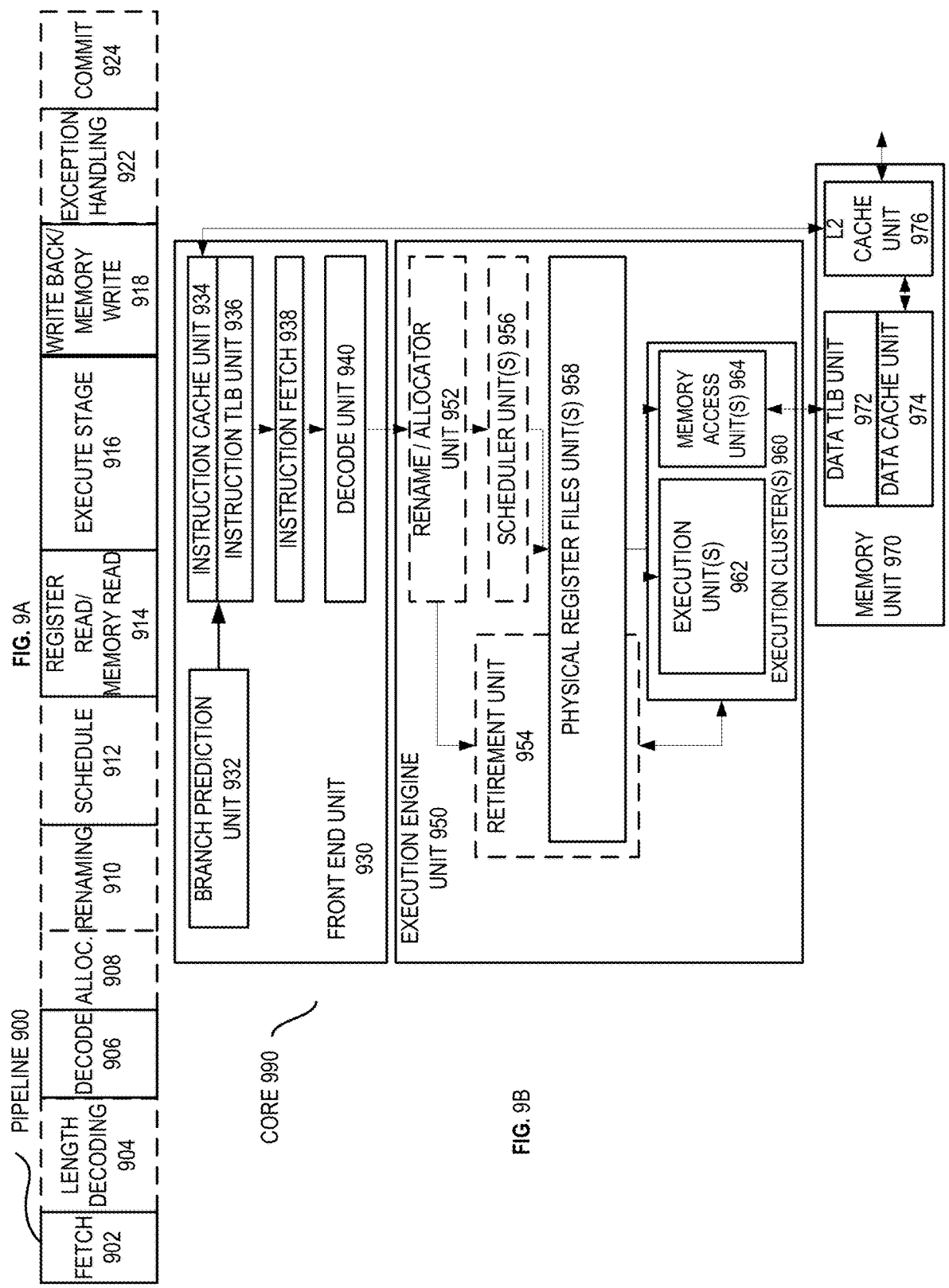

METHOD AND APPARATUS FOR ENERGY EFFICIENT DECOMPRESSION USING ORDERED TOKENS

FIELD

The present disclosure relates in general to the field of computer development, and more specifically, to data decompression.

BACKGROUND

A computing system may include one or more processors, one or more memory devices, and/or one or more communication controllers, among other components. Logic of the computing system may be operable to access and decompress a compressed data set.

BRIEF DESCRIPTION OF THE DRAWINGS

FIG. 9A is a block diagram illustrating both an exemplary in-order pipeline and an exemplary register renaming, out-of-order issue/execution pipeline in accordance with certain embodiments.

FIG. 9B is a block diagram illustrating both an exemplary embodiment of an in-order architecture core and an exemplary register renaming, out-of-order issue/execution architecture core to be included in a processor in accordance with certain embodiments;

Like reference numbers and designations in the various drawings indicate like elements.

DETAILED DESCRIPTION

Figure 1:
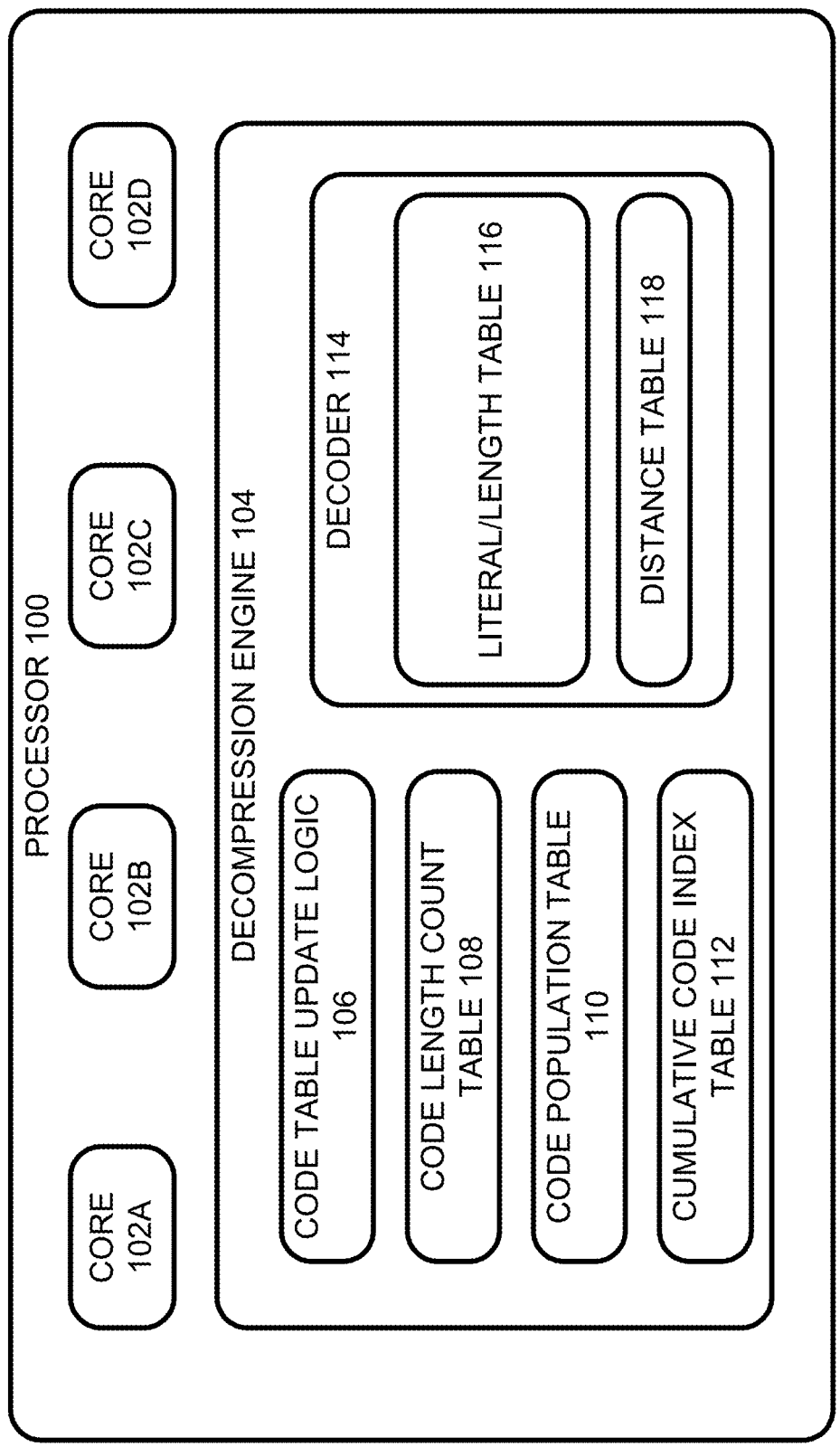
FIG. 1 illustrates a block diagram of an example processor comprising a decompression engine in accordance with certain embodiments.

FIG. 1 illustrates a block diagram of an example processor 100 comprising a decompression engine 104 in accordance with certain embodiments. Processor 100 may also include a plurality of cores 102 and any other suitable components. Decompression engine 104 may provide decompression acceleration according to various embodiments described herein.

Data compression is becoming an integral part of many information processing systems because of its ability to reduce storage requirement and communication bandwidth. Data compressed using lossless standards (e.g., gzip) has very high entropy and is generally decompressed before any subsequent processing takes place. Because of its critical role at the front end of information processing systems, decompression acceleration is critical for improving overall throughput. Content addressable memory (CAM) based decompression engines generally offer high throughput relative to other types of decompression engines. However, unlike, e.g., a register-file/static random access memory (SRAM) array based decompression engine where most of the logic remains idle, CAM arrays (particularly high speed NOR gate based CAM arrays) incur a significant power penalty due to high switching activity. High energy consumption may limit CAM usage in energy constrained SOCs, as well as undermine long-term reliability by generating hot-spots in high performance chips.

A CAM includes a memory that is searchable by data stored in the CAM. For example, a CAM searches its memory to see if an input data word is stored in the CAM. if the data word is found, the CAM returns the storage address where the word was found, contents at that storage address, and/or other associated data. A CAM array may accelerate a performance critical Huffman decoding step during decompression by matching the compressed payload against pre-computed Huffman codes stored within the CAM array. The search operation in a CAM array generates the same result regardless of the order in which its contents are populated. Typical CAM based Huffman decoder datapaths populate the CAM array in a pre-specified order as described by relevant standard being used. For example, a literal-length CAM array used with a DEFLATE algorithm may be initially populated with 256 literal tokens, followed by the end of block (EOB) token, and then the length tokens. A token may refer to one or more bits that compactly represent a value, such as a literal byte, a distance, a length, or other suitable value. Tokens may be referred to herein as codes. In various embodiments, the tokens used to encode a block of data may include tokens of various lengths.

In the typical system, Huffman codes are stored in their natural order in the CAM array. That is, the Huffman codes are stored in a CAM in an order that matches the order of the code lengths specified in association with a data block (each specified code length may correspond to a respective Huffman code that may be determined by the decompression engine after determining how many codes of each length are used). Such an approach results in a searching of the entire CAM during every decode cycle. This may lead to excessive power usage. For example, high speed NOR based CAMs operate by pre-charging all match lines and conditionally discharging them on mismatch, triggering switching activity in all but one CAM entry, resulting in high power dissipation during every search operation.

In various embodiments of the present disclosure, the codes are generated in an order according to code length and the codes are stored in a CAM array (or other lookup table) in increasing order of code lengths. In particular embodiments, the CAM array may be split into multiple CAM banks. The canonical nature of Huffman codes guarantees that longer Huffman codes will have a higher numeric value than shorter codes. Accordingly, a determination of whether a given payload will find a match in a particular CAM bank may be made by determining if the payload's numeric value is in between the numeric values of the leading and ending codes present in that bank (or equal to the leading and/or ending code). If the comparison indicates that the payload will find a match in the CAM bank, the CAM bank is enabled for a search operation. CAM banks that are guaranteed to miss the payload are not enabled, thus eliminating unnecessary switching activity during the search operation in the CAM banks that do not have the code matching the payload. Thus, various embodiments of the present disclosure provide significant power reduction by selectively activating only a portion of a CAM or other lookup table when a search is performed during decompression, thus eliminating redundant switching activity in the CAM without invoking a performance penalty. This technique may reduce or eliminate switching activity in the unused CAM banks and reduce CAM power dissipation by approximately $((n-1)*100/n)$ % in an n-way banked CAM. Simulation results show a total decompression engine power reduction of 52% by replacing a conventional CAM with a token sorting, 4-way banked CAM according to one embodiment.

Various embodiments may realize further energy saving by partitioning the CAM into critical and noncritical sections, and leaving the non-critical section idle a majority of the time. Typical decompression engines used with the DEFLATE algorithm attempt a worst-case 15 bit match every decode cycle to maximize performance, because such an approach guarantees a single cycle throughput for every Huffman code. Power savings may be realized by attempting a partial match (for example <10 bits) in a first attempt and a full match if the first attempt fails. However, such an approach would likely result in performance degradation in a conventional CAM populated with Huffman codes in arbitrary order of code length due to an additional cycle performance penalty for longer codes (for example >=10 bits). Various embodiments of the present disclosure that store codes in increasing order of code length in the CAM precompute the chance of a CAM miss in the first attempt with 100% accuracy, thus enabling power savings without sacrificing performance by opportunistically skipping the first partial attempt. For example, splitting a 15 bit match port of a CAM bank into a 9 bit critical port and 6 bit non-critical port while opportunistically disabling the non-critical port provides an estimated 13% additional energy saving on average for DEFLATE payloads.

Conventional power reduction schemes that are based on CAM banking/partitioning schemes generally exhibit performance degradation as well as side-channel leakage because of the strong correlation exhibited by these schemes' power signatures with the Huffman codes constituting the payload. Various embodiments may provide resiliency against such side-channel leakage by generating a low power signature that is independent of the payload. Particular embodiments may mitigate side-channel leakage in decompression engines by eliminating code length dependent switching activity from the datapath.

As described above, various embodiments may provide a decompression engine 104 to decompress a DEFLATE payload. DEFLATE is a widely deployed lossless compression/decompression standard and is used in many software applications/libraries including, but not limited to, GZIP, PKZIP, BZIP2, ZLIB, 7-ZIP, PNG, .ZIP, and other applications. The DEFLATE algorithm is specified in its basic format in Request for Comments (RFC) 1951, available at https://www.ietforg/rfc/rfc1951.txt. The DEFLATE operation compresses raw data into a stream of literal symbols and length+distance symbols that are subsequently Huffman encoded based on their frequency of occurrence to achieve further compression. Each symbol is represented by a code varying in length from 1b-15b. Some of the codes used to encode length and distance symbols may also utilize a variable number of additional bits (0-13b) from the payload that are concatenated with the Huffman decoded base during decompression.

While the embodiments of the disclosure described below focus on a DEFLATE compression operation using Huffman coding, the underlying principles of the disclosure may be implemented on any form of prefix coding and may also be used in other forms of lossless compression algorithms. As various examples, the techniques described herein may be applied to improve decoding performance for other forms of Huffman codes such as used in JPEG, MPEG, MP3, PNG, or other lossless compression algorithms.

In the embodiment of FIG. 1, a single decompression engine 104 is shared by all of the cores 102. In an alternate embodiment, each core includes its own instance (or multiple instances) of a decompression engine 104. In yet another embodiment, the decompression engine 104 may be implemented on a semiconductor chip separate from the semiconductor chip of the processor 100 and may be communicatively coupled to the processor over a communication link/bus. The underlying principles of the present disclosure are not limited to any particular architectural arrangement for integrating the decompression engine 104 into a computer system.

Decompression engine 104 includes code table update logic 106, code length count table 108, code population table 110, cumulative code index table 112, and decoder 114. Decoder 114 includes literal/length table 116 and distance table 118. The tables 116 and 118 may comprise lookup tables that may be implemented using any suitable type of memory. Non-limiting examples of memory that could be used to store the lookup tables include SRAM and CAM (e.g., NOR or NAND based CAMs). In other embodiments, any suitable number of tables may be used to store tokens used during decoding. Similarly, any suitable type of memory may be used to store tables 106, 108, 110, and 112.

Code table update logic 106 analyzes a payload header of an incoming data block and populates code tables 108, 110, 112, 116, and 118 based on information specified in the header. In various embodiment, the payload header may specify a plurality of code lengths that may be used to determine the codes used for the literal, length, and distance symbols. In various embodiments, these code lengths themselves may be Huffman encoded. The process of code generation and population of the codes into a lookup table (e.g., literal/length table 116) is described in more detail in connection with FIG. 3.

In one embodiment, symbol values corresponding to the literal and length codes for a data block are placed together in literal and length table 116, while symbol values corresponding to the distance codes for the data block are stored in distance table 118. After the tables 116 and 118 are populated, literals and/or length+distance pairs from the payload are decoded by decoder 114 by matching codes from the payload to codes included in the tables to recreate the original bit-stream by decoder 114.

Every new block's header is processed to generate Huffman codes unique to the block's symbols and the corresponding symbol values are populated into the tables at indices corresponding to the codes. For example, a header of a new block is processed after the EOB symbol of the current block is reached during decoding and all tables are repopulated before decoding the new block of compressed data.

In a particular embodiment, decoder 114 comprises at least one lookup table (e.g., literal/length table 116 and/or distance table 118) that includes entries addressed by codes. For example, an address that includes (e.g., begins with) a code may be used as an index into the table and a symbol value corresponding to the code may be obtained from the corresponding entry of the table. In various embodiments, an entry of the lookup table also includes a validity identifier specifying whether the entry stored in the entry of the lookup table is valid and a length identifier specifying how long the code was (since the address used to index the lookup table may include subsequent bits that are not a part of the current code if the address ends up being longer than the identified code). The symbol values may be expressed in any suitable manner. In a particular embodiment, a symbol value of a literal may be a value from 0 to 255 corresponding to a literal byte, a symbol value of a length includes bits specifying at least a portion of the length (e.g., the most significant bits) and (at least in some cases) bits specifying how many additional bits from the payload should be appended to the bits specifying the portion of the length, and a symbol value of a distance includes bits specifying at least a portion of the distance (e.g., the most significant bits) and (at least in some cases) bits specifying how many additional bits from the payload should be appended to the bits specifying the portion of the distance.

During Huffman decoding, decoder 114 compares a portion of the payload against entries in the code tables. A successful decode cycle results in generation of the code length and the corresponding symbol for the matching Huffman code. The code length is used to advance the encoded stream to fetch the next payload. For example, the sum of the code length and (if applicable) the extra number of bits that get picked from the payload is the actual number of bits that gets consumed in any particular decode cycle. The payload is shifted (i.e., the index of the decoder advances) by the number of bits consumed to generate the next set of bits (e.g., 15 bits) to be used for decoding.

Figure 2:
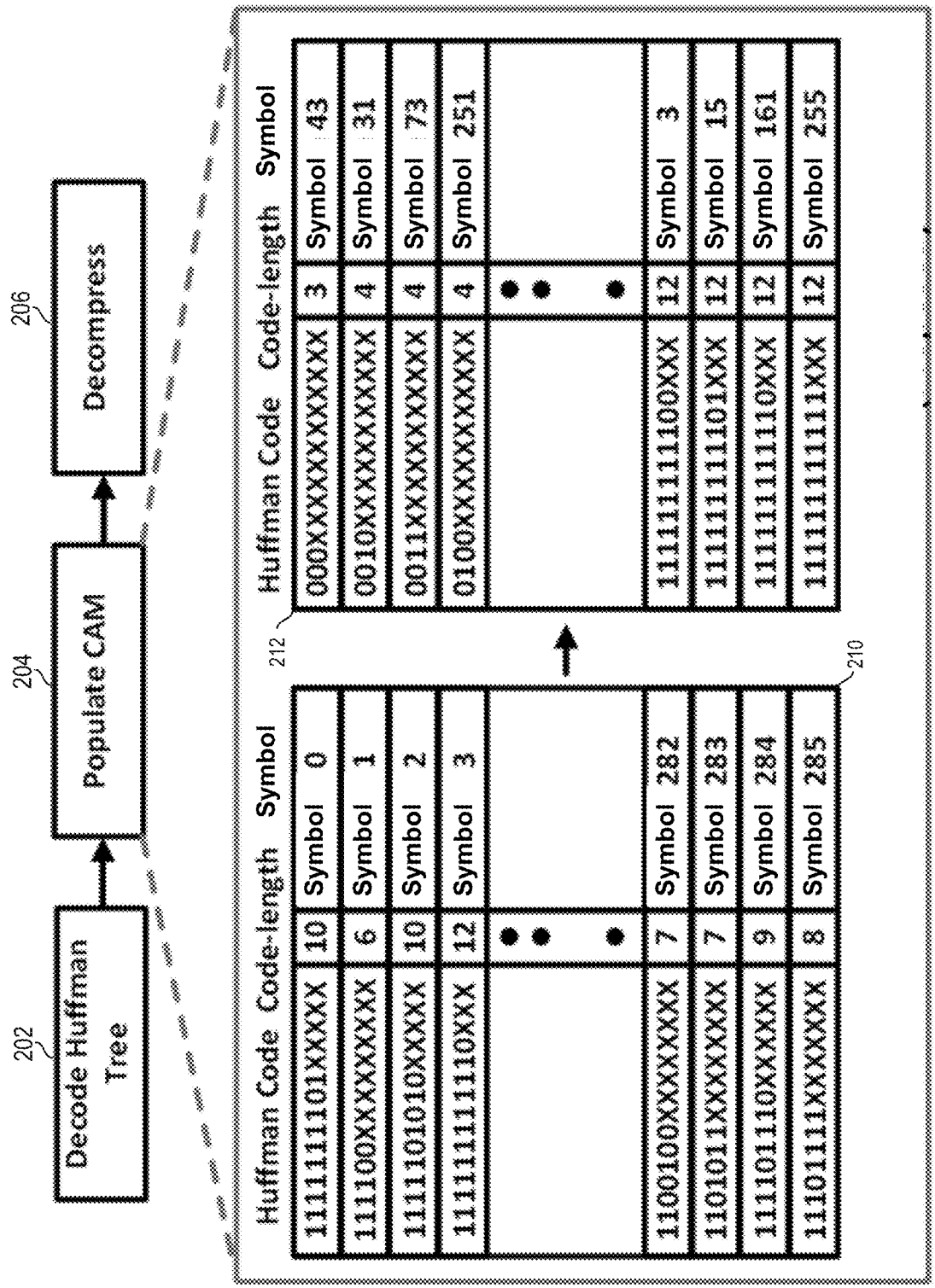
FIG. 2 illustrates an example decompression flow and example content addressable memory (CAM) population schemes in accordance with certain embodiments.

FIG. 2 illustrates an example decompression flow and two example CAM population schemes in accordance with certain embodiments. The decompression flow may represent a flow for use in a CAM based DEFLATE decompression hardware accelerator, although the flow may be adapted to the population of any suitable lookup table with any suitable tokens. The flow includes decoding a Huffman tree at 202, populating a CAM at 204, and decompressing data at 206. In the first phase 202, compressed metadata of a data block is decoded by parsing a payload header to generate the literal-length and distance Huffman codes used to construct the encoded payload in a manner similar to that described above. The second phase 204 includes storing these pre-computed Huffman codes and associated uncompressed data (e.g., symbols such as literal values, length values, base values, extra-bits, or other information that may be encoded within a data block) in a CAM. In the third phase, the payload is decompressed by matching codes in the payload against the Huffman codes stored in the CAM.

In addition to an example decompression flow, FIG. 2 illustrates two example CAM population schemes 210 and 212 that may be used during the populate CAM phase 204. As described above, the CAM may be populated with Huffman codes based on metadata included in a payload header. In DEFLATE, the payload header packs the code lengths for the 256 literal codes, end-of-block (EOB) code, a maximum of 20 length codes and 30 distance codes in a pre-specified order as described in the DEFLATE standard. Hence, in a typical decompression engine the Huffman codes are also generated in this pre-specified order and progressively stored in the CAM as shown in scheme 210. Since the order is specified by the DEFLATE standard, the decompression engine 104 knows which codes (and corresponding symbols) correspond to particular code lengths, thus the first Huffman code stored is the code corresponding to symbol 0, the second Huffman code stored is the code corresponding to symbol 1, and so on (where the symbol numbers are defined by the DEFLATE standard). Decompression of the payload at the third phase may include matching the compressed bitstream against the codes stored in the CAM. Because the code length is variable it can be determined only after matching the payload, and since the CAM is populated in an arbitrary order of code lengths, the entire CAM needs to be activated every decode cycle. High speed CAMs (e.g., CAMS that are built with a NOR based cells) may pre-charge all match lines of the CAM and selectively discharge all lines corresponding to unmatched contents resulting in very high switching activity and dynamic power. As one example, 14 nanometer (nm) circuit simulations indicate that a 286 entry literal-length CAM and a 30 entry distance CAM may dissipate 80% of the total power consumed during decompression of a DEFLATE payload.

In contrast to the CAM population scheme 210, CAM population scheme 212 depicts a ordered Huffman code population scheme that provides significant energy reduction during CAM searches. Because a CAM search generates the same result regardless of the order in which its contents are stored, the Huffman code entries in the literal-length and distance CAMs can be rearranged to achieve lower power searches without disrupting functionality of the CAM. In CAM population scheme 212, the Huffman codes are stored in increasing order of code lengths as opposed to the standard pre-specified order. In a particular embodiment, the entries of the CAM are ordered based primarily on ascending code lengths and secondarily on ascending Huffman codes of the same code length. For example, the first entry has a code length of 3, the second, third, and fourth entries have code lengths of 4 (with the numeric value of the Huffman codes increasing with each entry), and so on. This approach (when coupled with the property of Huffman codes that codes with long code lengths have larger numeric values than codes with short code lengths) allows the decompression engine 104 to determine which section of a CAM is expected to hit a given payload before the CAM is accessed during the search operation. An example of how the section of the CAM is identified is provided below in connection with FIG. 4.

Regarding the statement above that numeric values of Huffman codes increase with increasing code length, scheme 212 illustrates Huffman codes arranged by increasing numeric values. The don't care bits (marked as Xs in FIG. 2) are included within the least significant bits (i.e., on the right side) in the representations of the Huffman codes. The most significant bits of the Huffman codes are determinative of the ordering of the numeric values of the codes and the value of these bits increase with increasing code length. For example in scheme 212, the three most significant bits of any CAM entry populated based on the first Huffman code are 000. However, for the next Huffman code that is populated in the CAM, the three most significant bits are 001 (thus the numeric value is larger for this Huffman code than for the first Huffman code). The numeric values increase across Huffman codes of the same length as well. For example, the four most significant bits of the first length 4 code are 0010, the four most significant bits of the second length 4 code are 0011, and the four most significant bits of the third length 4 code are 0100. As used herein, the numeric value may refer to the integer value corresponding to the defined bits of a code (i.e., the bits that are not don't care bits). For example, the numeric value of 000XXXXXXXXXXXX is 0; the numeric value of 0010XXXXXXXXXXX is $2^{12}$=4,096; the numeric value of 0011XXXXXXXXXXX is $2^{12}+2^{11}$=6,144; and the numeric value of 0100XXXXXXXXXXX is $2^{13}$=8,192.

Figure 3:
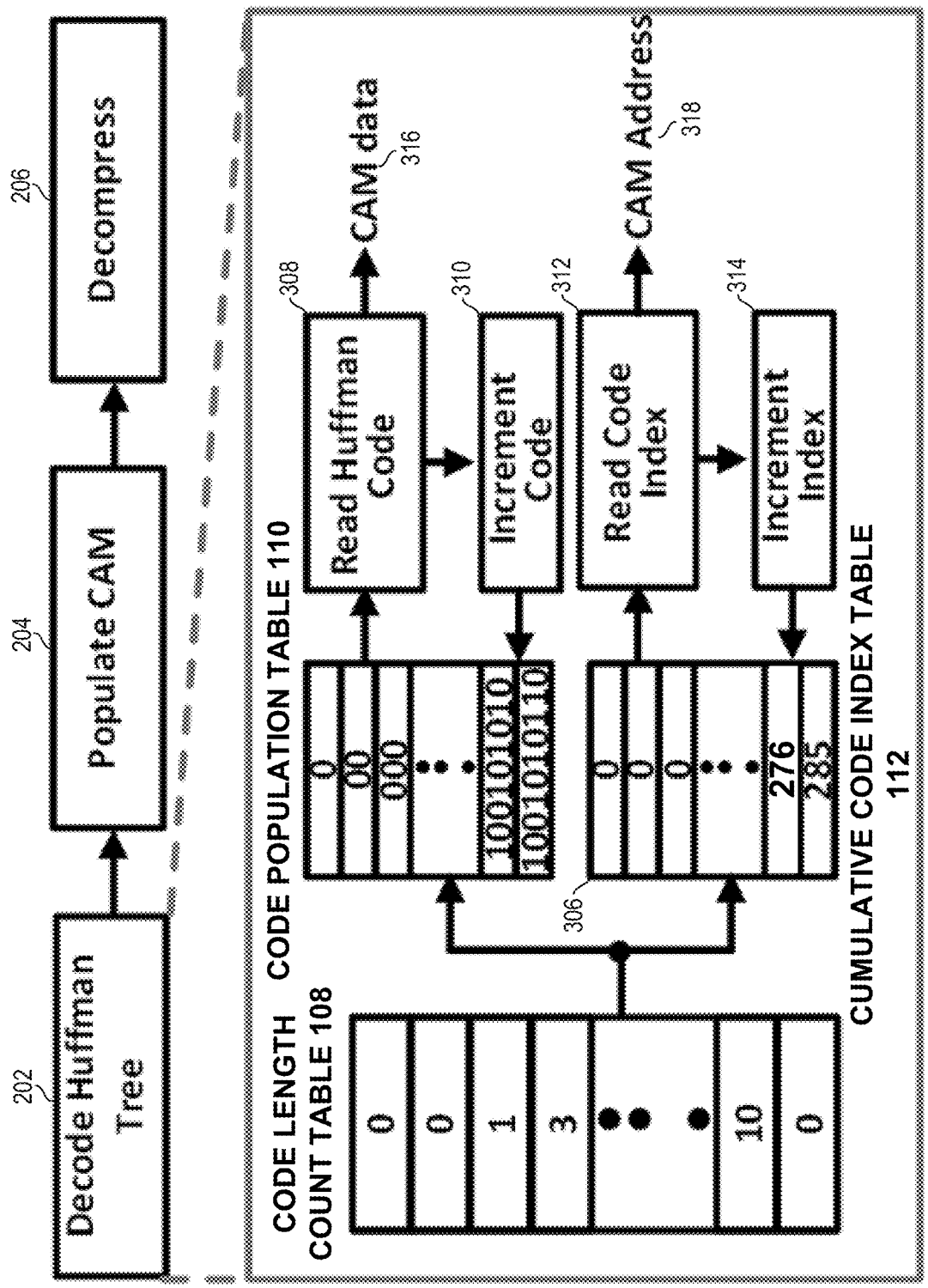
FIG. 3 illustrates example logic for decoding a Huffman tree in accordance with certain embodiments.

FIG. 3 illustrates example logic for decoding a Huffman tree in accordance with certain embodiments. The logic includes various tables, including code length count table 108, code population table 110, and cumulative code index table 112. The logic also includes a Huffman code reader 308, a code incrementer 310, a code index reader 312, and a code index incrementer 314 (which may be included within code table update logic 106). In a particular embodiment, code population table 110 and cumulative code index table 112 are derived from code length count table 108 and the same physical memory used to store code length count table 108 for a particular data block may be rewritten to store at least a portion of code population table 110 and/or cumulative code index table 112.

Traditional Huffman tree decode approaches create codes in the pre-specified order that are populated in a CAM progressively as the codes are generated. In various embodiments described herein, the Huffman codes are generated with their respective cumulative indices that reflect the relative order of the codes when arranged in increasing order of lengths. The cumulative indices are used as addresses during population of the CAM.

In a particular embodiment, the Huffman codes are generated in a double parse technique. During the first parse of code metadata (e.g., a DEFLATE header), the number of codes corresponding to each length is updated and stored in code length count table 108. In the example depicted in FIG. 3, for a particular header the number of 1-bit codes is 0, the number of 2-bit codes is 0, the number of 3-bit codes is 1, the number of 4-bit codes is 3, the number of 5-bit through 13-bit codes is not shown, the number of 14-bit codes is 10, and the number of 15-bit codes is 0. The code length count table 108 may include an entry for each possible code count (e.g., 15 entries for the DEFLATE algorithm).

After the first parsing of the header, the starting Huffman codes for each code length are generated. Each entry in the code population table 110 may correspond to a particular code length and may store the next code to be stored in the CAM for that particular code length. The starting codes of table 110 may be generated based on the code counts of table 108 (e.g., according to the DEFLATE specification or other information describing the method used during Huffman encoding). The initial values stored in the code population table 110 represent the first Huffman codes for each code length. For example, the first code of table 110 represents the first Huffman code of length 1 (if any), the second code of table 110 represents the first Huffman code of length 2 (if any), and so on. A particular entry is only used in populating the CAM if code lengths of that size exist. For example, in the example depicted, the first, second and fifteenth entry will not be used because there are no 1 bit, 2 bit, or 15 bit codes.

After the first parsing of the header, the initial values for the cumulative code index table 112 may also be generated. Each entry in the cumulative code index table 112 may correspond to a particular code length. The initial values of cumulative code index table 112 may also be generated based on the code counts of table 108. An initial value stored in the cumulative code index table 112 represents the CAM address at which the first Huffman code for the code length corresponding to the entry of the cumulative code index table 112 is to be stored. Because there are no 1 or 2-bit codes, the first two entries of the cumulative code index table 112 may be ignored (for this particular header). The one 3-bit code is to be stored at address 0. Although not depicted, the first 4-bit code is to be stored at address 1 and the first 14-bit code is to be stored at address 276. Because there are no 15 bit codes, the last entry of the cumulative code index table 112 may also be ignored (for this particular header). In this example, the initial value of an entry N of the cumulative code index table 112 (where N=0, 1, 2, ..., 14) is the sum of the entries in the code length count table 108 up to entry N of the code length count table. For example, the initial value of entry 5 of the cumulative code index table (which corresponds to a code length of 6) is the sum of the code counts for the 1-bit, 2-bit, 3-bit, 4-bit, and 5-bit codes.

During the second parsing of the header, a code length is read from the header and used to index into the code population table 110 and the cumulative code index table 112. The Huffman code at the corresponding index of code population table 110 is read by Huffman code reader 308 and output as CAM data 316. Similarly, the cumulative code index at the corresponding location of cumulative code index table 112 is read by code index reader 312 and output as CAM address 318. An entry of the CAM may be populated at the CAM address 318 with the CAM data 316. The code at the indexed entry of code population table 110 is then incremented (or otherwise updated) to generate the next code that is the same length as the accessed code (in Huffman encoding, the numeric value of a code of is simply one more than the numeric value of the previous code of the same length). Similarly, the cumulative code index at the indexed entry of cumulative code index table 112 is then incremented (or otherwise updated) to generate the CAM address for the next code that is the same length as the accessed code. In this manner, the codes of the CAM will be ordered primarily by code length, and secondarily by ascending codes of the same code length. The embodiments described above (and other similar embodiments) do not require an explicit sorting step to reorder the Huffman codes and can hence be easily incorporated into a conventional Huffman tree generation unit without impacting code generation latency.

Figure 4:
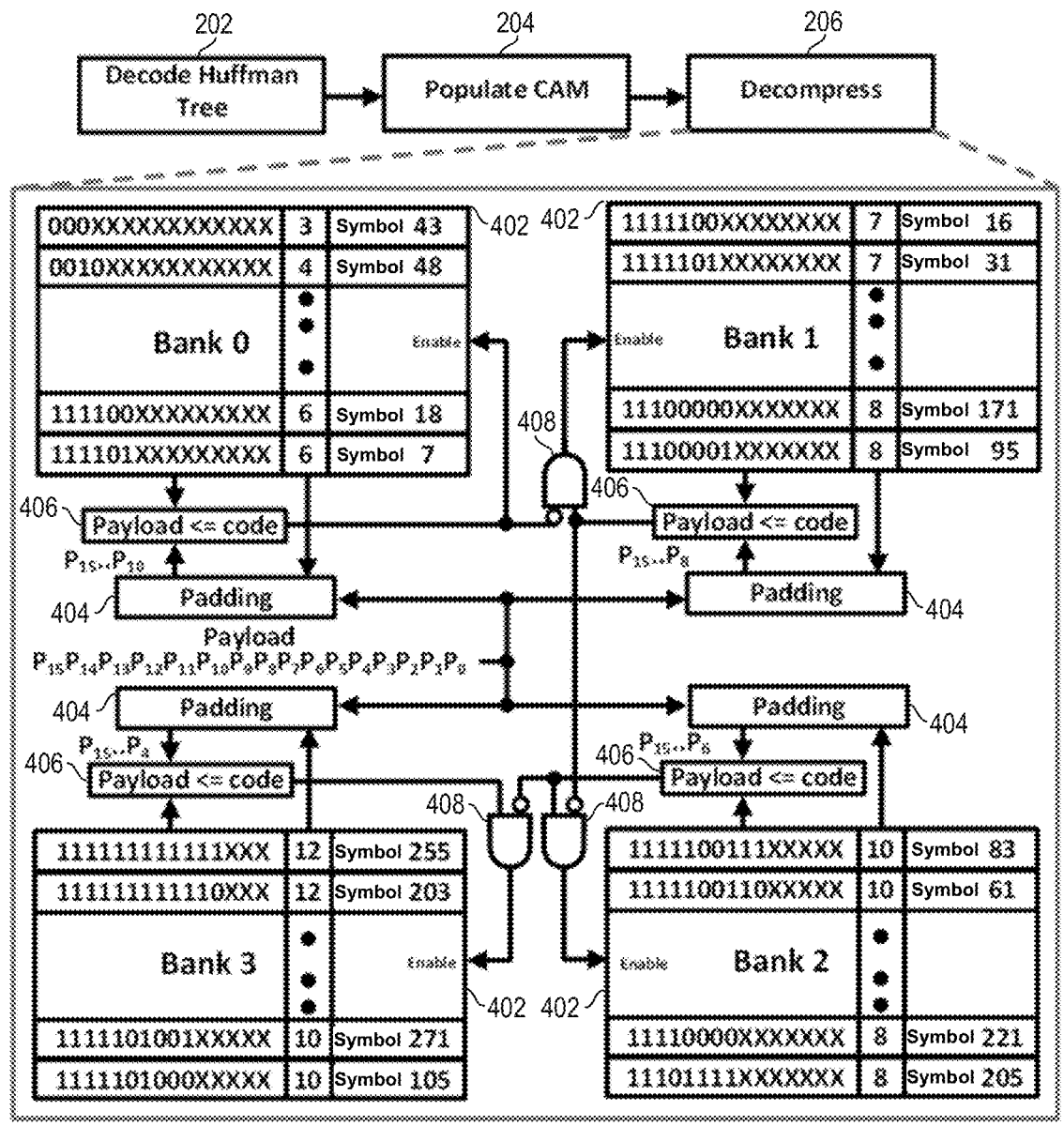
FIG. 4 illustrates example CAM banks and associated decompression logic in accordance with certain embodiments.

FIG. 4 illustrates example CAM banks 402 and associated decompression logic in accordance with certain embodiments. The CAM banks 402 and associated logic may be used during the decompression phase 206. The CAM depicted is a 4-way banked literal-length CAM populated in increasing order of code lengths. Thus, the CAM may represent an example embodiment of literal/length table 116, though in other embodiments, the CAM (or other lookup table) may store any suitable tokens. In various embodiments, the CAM may be divided into any suitable number of portions (e.g., banks or other segments).

During decompression, a determination is made as to which CAM bank includes the next code inside the payload $P_{15}$-$P_0$ based on a numeric value of the payload and the numeric values of codes stored inside the different banks. For example, at least a portion of payload $P_{15}$-$P_0$ may be compared against the last Huffman code (i.e., the Huffman code having the highest numeric value) in each bank 402 (or other portion) of the CAM to determine whether the payload will hit in the respective bank during a search operation. For example, for a particular bank, the most significant N bits of the payload may be compared against the most significant N bits of the last Huffman code of the bank, where N is the length of the last Huffman code stored in the particular bank. The results of these comparisons are used to opportunistically deactivate all CAM banks 402 except for the CAM bank that is guaranteed to generate a match.

The embodiment depicted includes logic simplifying such comparisons, such as padding logic 404. Each module of padding logic 404 receives the payload and the highest code length (N) from an associated bank 402 and outputs the most significant N bits of the payload and 15-N padded bits (e.g., each set to logical 0) appended to the most significant N bits for comparison by comparison logic 406 against the last code of the associated bank 402. In other embodiments, the payload could simply be truncated to the most significant N bits and compared against the most significant N bits of the last code or the comparison may be made in any other suitable fashion. Comparison logic 406 may determine whether a numeric value of the payload (it doesn't matter whether it's the numeric value of the entire payload or the numeric value of the most significant N bits of the payload) is less than or equal to a numeric value of the last Huffman code.

For bank 0, if the numeric value of the padded payload is less than or equal to the numeric value of the last code of bank 0, then the next code in the payload is guaranteed to hit in bank 0 and banks 1, 2, and 3 are not enabled during the search operation. If the numeric value of the padded payload is greater than the last code of bank 0, then bank 0 is not enabled during the search portion. Similar padding and comparisons may be performed for each other bank. For each of the other banks, if the padded payload is less than the last code of the respective bank, but greater than the last code of all preceding banks, then that bank is enabled while all other banks are disabled during the search operation. In the embodiment depicted, the enablement scheme is implemented with AND gates 408 coupled to a respective comparison logic 406 and comparison logic 406 associated with a previous bank, though any suitable logic may be used.

Figure 5:
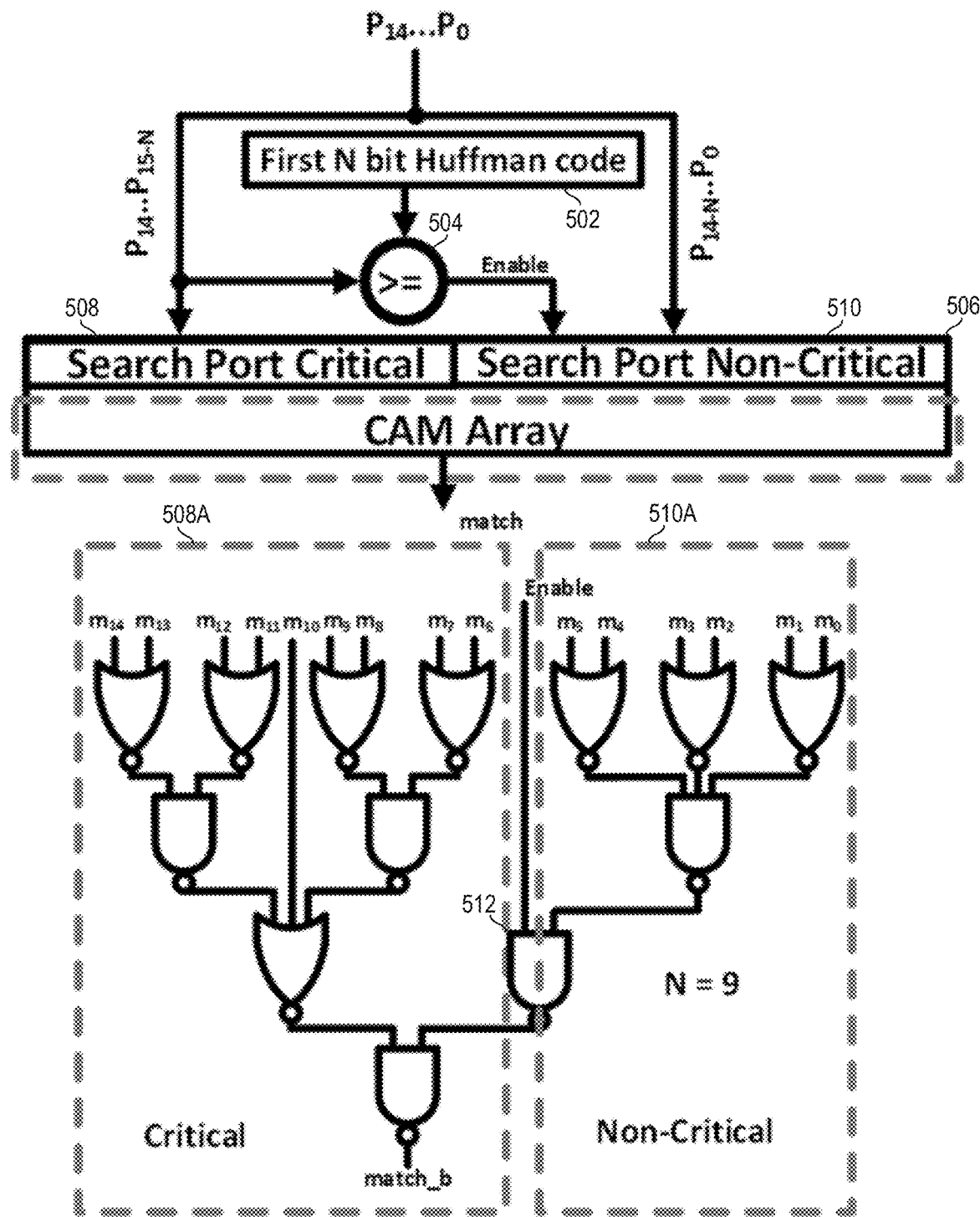
FIG. 5 illustrates example logic for selectively enabling and disabling a non-critical port of a CAM bank in accordance with certain embodiments.

FIG. 5 illustrates example logic for selectively enabling and disabling a non-critical port 510 of a CAM array 506 in accordance with certain embodiments. CAM array 506 includes the non-critical port 510 and a critical port 508. In a particular embodiment, the non-critical port 510 is only enabled when comparison logic 504 determines that the numeric value of the incoming payload requires the use of the non-critical port 510.

In addition to selectively enabling only the CAM bank (or other portion of a lookup table) that includes the next Huffman code of the payload, various embodiments may further reduce power by limiting activity within the CAM bank (or portion of the lookup table) that gets accessed in a given decode cycle. Although applications like DEFLATE provide a large code length range for Huffman encoding, most of the payloads can be compressed using codes that are considerably smaller than the longest permissible code. For example, on average 95% of DEFLATE literal-length and distance tokens are comprised of codes that are less than 10 bits. Hence, partitioning the CAM search logic into critical (e.g., 1 bit through 9 bit) and non-critical (10 bit through 15 bit) sections and accessing the non-critical section only when the payload needs to be compared against one or more of the bits of the non-critical section leads to additional power savings.

FIG. 5 depicts an example portioning approach for N bit partitioning (where N is the number of bits in the critical port and 15-N is the number of bits in the non-critical port). A 15 bit register 502 stores the first N bit code (e.g., a 9 bit code when N=9) generated during Huffman code generation (i.e., the 9 bit code with the lowest numeric value). Because of the canonical nature of Huffman codes, comparing this boundary code with the numeric value of the payload indicates whether the non-critical section should be activated (since if the numeric value of the payload is less than this boundary code, then the next code of the payload will be less than 9 bits long). Simulation results including the overhead for the extra register and comparison for DEFLATE payload decompression show that a particular embodiment implementing the displayed partitioning scheme reduces bank search power by 30%.

Logic 508A represents a portion of the critical port 508 that is specific to a particular CAM entry and logic 510A represents a portion of the non-critical port 510 that is specific to the same CAM entry. In the embodiment depicted, $m_{14}$-$m_0$ each represent an indication of whether there was a match between a bit of a Huffman code in the CAM array 506 and a corresponding bit in the payload. Logic of the critical and non-critical ports then determine whether each bit matched (indicating a CAM hit at that particular entry of the CAM) or whether at least one bit did not match (indicating there was not a CAM hit at that particular entry of the CAM).

The enable signal that is the output by comparison logic 504 is activated only if the payload has a numeric value that is higher than or equal to the first N bit Huffman code. In a particular embodiment, this enable signal is fed to logic (e.g., AND gate 512) that enables the combined result of the match bits $m_5$-$m_0$ associated with the non-critical port 510 of the CAM to be passed through to be combined with the combination of match bits 11114-1116 associated with the critical port 508. If the enable signal is deactivated, the logic that combines the match bits $m_5$-$m_0$ is turned off. In a particular embodiment, each entry of the CAM has logic that is similar to the logic 508A and 510A (or other logic that performs a similar function) and the enable signal from comparison logic 504 is provided to each set of such logic. Thus a single register 502 and comparison logic 504 can control the selective enabling of the non-critical port for each entry of the CAM array, resulting in significant power savings.

Figure 6:
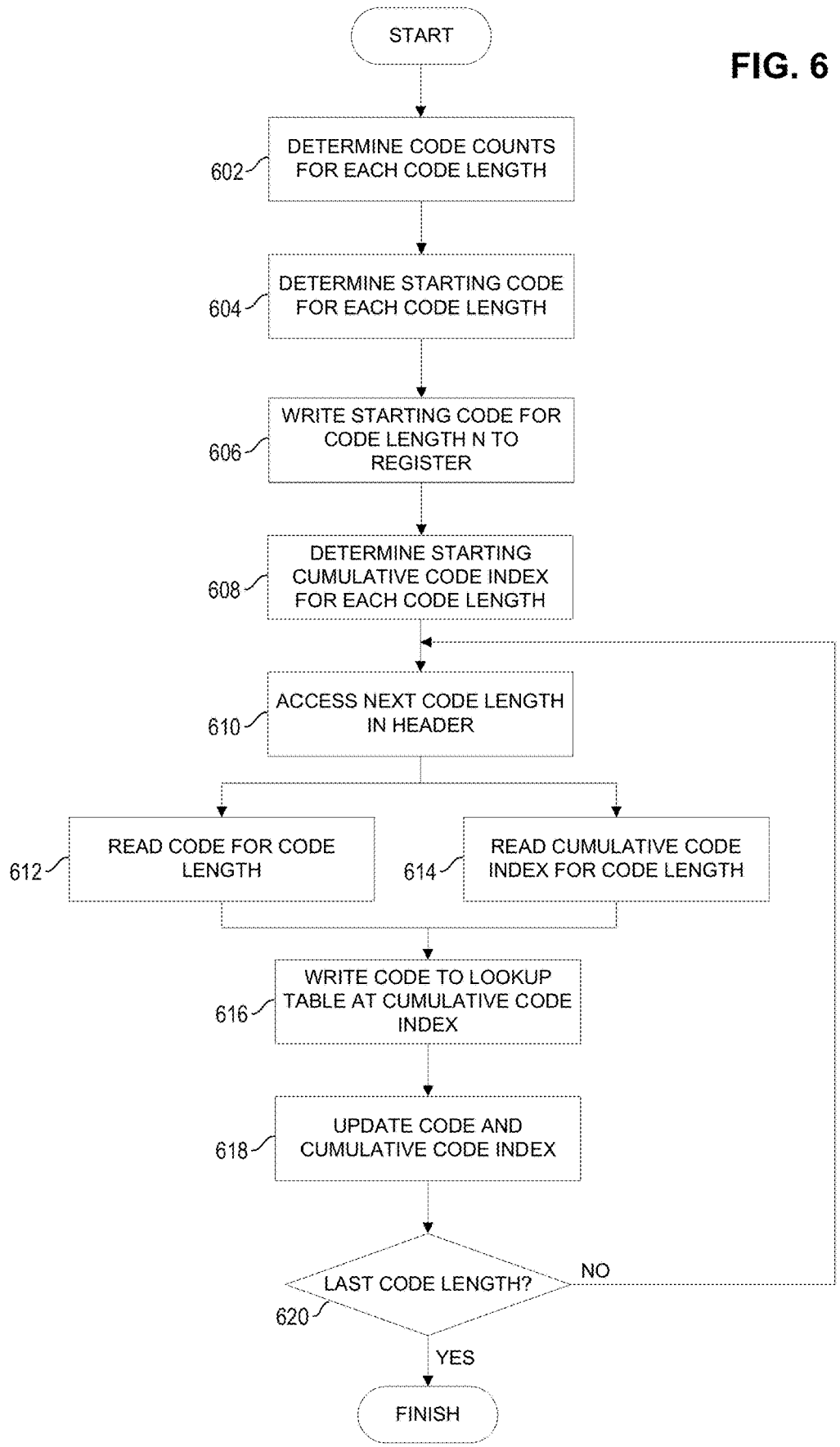
FIG. 6 illustrates an example flow for populating a lookup table based on the order of numeric values of Huffman codes in accordance with certain embodiments.

FIG. 6 illustrates an example flow for populating a lookup table based on the order of numeric values of Huffman codes in accordance with certain embodiments. The operations, along with any other operations described herein relating to decompression of a data set, may be performed by any suitable logic, such as decompression engine 104.

At 602, code counts are determined for each code length. For example, a header associated with a block of data may be parsed. The header may include a series of code lengths. Each time a particular code length is encountered during the parsing of the header, the code count for that particular code length is incremented. At 604, a starting code is determined for each code length. For example, a starting code for code length 1, another starting code for code length 2, another starting code for code length 3, etc. may be determined. In a particular embodiment, if the code count for a particular code length is 0, a starting code count is not determined for that code length. The values of the starting code values may be based on the values of the code counts (e.g., as defined in the DEFLATE or in accordance with any other encoding specification).

At 606, the starting code for a particular code length N is written to a register (or other memory element), where the code length N demarcates the boundary between a critical portion and a non-critical portion of the lookup table. This value may be used to determine whether the payload includes a code that is N bits or longer (and thus whether a non-critical portion of the lookup table is to be enabled during the search operation). At 608, a starting cumulative code index is determined for each code length. The starting cumulative code index may be based on the code count values as described above. In a particular embodiment, a starting cumulative code index is not determined for code lengths that have code counts of 0.

At 610, a code length specified in the header is accessed. At 612, a code corresponding to the code length is read (e.g., from code population table 110). At 614, a cumulative code index corresponding to the code length is read (e.g., from cumulative code index table 112). The first time each code length is encountered, the corresponding code and the cumulative code index are the starting code and the starting cumulative code index for that code length. At 616, the code that was read is written to the lookup table at the cumulative code index that was read. At 618, the code corresponding to the code length is updated to the next code and the cumulative code index corresponding to the code length is updated to the next cumulative code index for that particular code length. In a particular embodiment, the code and cumulative code index are both incremented, although in other embodiments the code and/or cumulative code index may be updated in any suitable manner.

At 620, a determination is made as to whether the accessed code length is the last code length to be processed. If it is not the last code length, the flow returns to 610. If it is the last code length, the flow ends.

Figure 7:
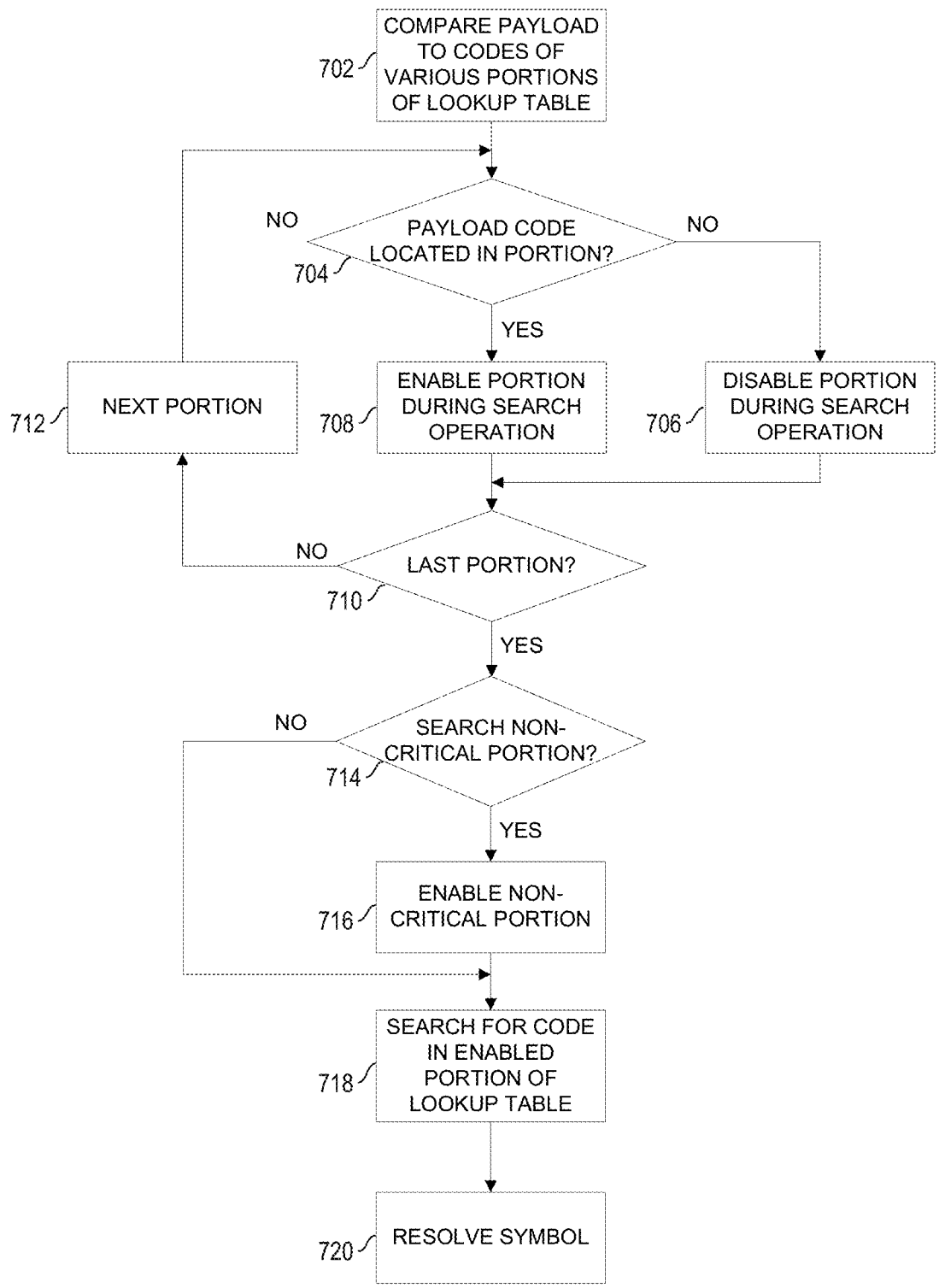
FIG. 7 illustrates an example flow for performing a search for a Huffman code in accordance with certain embodiments.

FIG. 7 illustrates an example flow for performing a search for a Huffman code in accordance with certain embodiments. The flow may be performed by any suitable logic, such as decompression engine 104. At 702, a payload is compared to codes of various portions of a lookup table. A portion of a lookup table may represent any suitable segment of any suitable lookup table. In a particular embodiment, each portion is a bank of a CAM. In a particular embodiment, a code from each portion is compared against a payload. The comparison may include comparing a payload with the respective codes of the different portions of the lookup table to determine whether a code in the payload is included the respective portions.

At 704, a determination is made, for a particular portion of the lookup table, as to whether a code in the payload is located in the portion. This determination may be made based on the comparison performed at 702 (and may be made without an explicit search within the lookup table portion for the code of the payload). If a determination is made that the code is not in the portion, that portion is disabled at 706. If a determination is made that the code is in the portion, that portion is enabled at 708. If a similar determination has not yet been made for any other portions of the lookup table, a next portion may be identified and the flow may return to 704. In various embodiments, the determination illustrated at 704 may be performed in parallel for each portion of the lookup table.

At 714, a determination is made as to whether a non-critical portion of the lookup table should be searched. In a particular embodiment, this determination is based on a comparison of the payload against a starting code for an N-bit code length (where the first N–1 bits are associated with a critical portion of the lookup table and the remainder of the bits are associated with a non-critical portion of the lookup table). If the numeric value of the payload is equal to or greater than the numeric value of the starting code, then the non-critical portion is enabled at 716. At 718, the payload is compared against lookup table entries in the portion of the lookup table that was enabled, a match is found, and a symbol associated with the matched code is resolved at 720.

Figure 8:
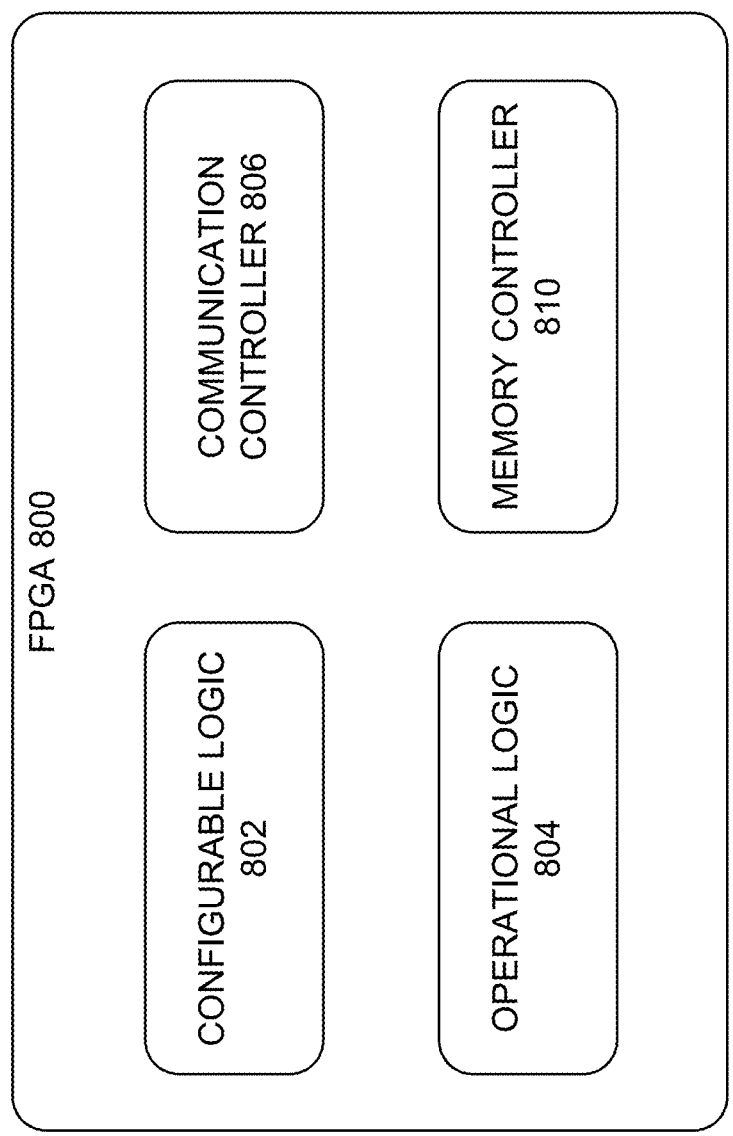
FIG. 8 illustrates an example field-programmable gate array (FPGA) in accordance with certain embodiments.

The flows described in FIGS. 7 and 8 are merely representative of operations that may occur in particular embodiments. In other embodiments, additional operations may be performed. Various embodiments of the present disclosure contemplate any suitable signaling mechanisms for accomplishing the functions described herein. Some of the operations illustrated in FIGS. 7 and 8 may be repeated, combined, modified or omitted where appropriate. Additionally, operations may be performed in any suitable order without departing from the scope of particular embodiments.

The proposed approach to opportunistically deactivate portions of lookup tables can be extended to any accelerator design regardless of the underlying circuits used to construct the lookup table, and hence can be easily incorporated into existing accelerators to reduce power. The embodiments described herein may be implemented using any suitable logic, including fixed logic, software, or an FPGA based platform (described in more detail below in connection with FIG. 9).

The figures below detail exemplary architectures and systems to implement embodiments of the above. In some embodiments, one or more hardware components and/or instructions described above are emulated as detailed below, or implemented as software modules.

FIG. 8 illustrates an example block diagram of a field programmable gate array (FGPA) 800 in accordance with certain embodiments. In a particular embodiment, a decompression engine may be implemented by an FPGA 800. An FPGA may be a semiconductor device that includes configurable logic. An FPGA may be programmed via a data structure (e.g., a bitstream) having any suitable format that defines how the logic of the FPGA is to be configured. An FPGA may be reprogrammed any number of times after the FPGA is manufactured.

In the depicted embodiment, FPGA 800 includes configurable logic 802, operational logic 804, communication controller 806, and memory controller 810. Configurable logic 802 may be programmed to implement one or more kernels. A kernel may comprise configured logic of the FPGA that may receive a set of one or more inputs, process the set of inputs using the configured logic, and provide a set of one or more outputs. The kernel may perform any suitable type of processing. In various embodiments, a kernel may comprise a decompression engine. Some FPGAs 800 may be limited to executing a single kernel at a time while other FPGAs may be capable of executing multiple kernels simultaneously. The configurable logic 802 may include any suitable logic, such as any suitable type of logic gates (e.g., AND gates, XOR gates) or combinations of logic gates (e.g., flip flops, look up tables, adders, multipliers, multiplexers, demultiplexers). In some embodiments, the logic is configured (at least in part) through programmable interconnects between logic components of the FPGA.

Operational logic 804 may access a data structure defining a kernel and configure the configurable logic 802 based on the data structure and perform other operations of the FPGA. In some embodiments, operational logic 804 may write control bits to memory (e.g., nonvolatile flash memory or SRAM based memory) of the FPGA 800 based on the data structure, wherein the control bits operate to configure the logic (e.g., by activating or deactivating particular interconnects between portions of the configurable logic). The operational logic 804 may include any suitable logic (which may be implemented in configurable logic or fixed logic), such as one or more memory devices including any suitable type of memory (e.g., random access memory (RAM)), one or more transceivers, clocking circuitry, one or more processors located on the FPGA, one or more controllers, or other suitable logic.

Communication controller 806 may enable FPGA 800 to communicate with other components (e.g., a compression engine) of a computer system (e.g., to receive commands to compress data sets). Memory controller 810 may enable the FPGA to read data (e.g., operands or results) from or write data to memory of a computer system. In various embodiments, memory controller 810 may comprise a direct memory access (DMA) controller.

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

FIG. 9A is a block diagram illustrating both an exemplary in-order pipeline and an exemplary register renaming, out-of-order issue/execution pipeline according to embodiments of the disclosure. FIG. 9B is a block diagram illustrating both an exemplary embodiment of an in-order architecture core and an exemplary register renaming, out-of-order issue/execution architecture core to be included in a processor according to embodiments of the disclosure. The solid lined boxes in FIGS. 9A-B illustrate the in-order pipeline and in-order core, while the optional addition of the dashed lined boxes illustrates the register renaming, out-of-order issue/ execution pipeline and core. Given that the in-order aspect is a subset of the out-of-order aspect, the out-of-order aspect will be described.

In FIG. 9A, a processor pipeline 900 includes a fetch stage 902, a length decode stage 904, a decode stage 906, an allocation stage 908, a renaming stage 910, a scheduling (also known as a dispatch or issue) stage 912, a register read/memory read stage 914, an execute stage 916, a write back/memory write stage 918, an exception handling stage 922, and a commit stage 924.

FIG. 9B shows processor core 990 including a front end unit 930 coupled to an execution engine unit 950, and both are coupled to a memory unit 970. The core 990 may be a reduced instruction set computing (RISC) core, a complex instruction set computing (CISC) core, a very long instruction word (VLIW) core, or a hybrid or alternative core type. As yet another option, the core 990 may be a special-purpose core, such as, for example, a network or communication core, compression and/or decompression engine, coprocessor core, general purpose computing graphics processing unit (GPGPU) core, graphics core, or the like.

The front end unit 930 includes a branch prediction unit 932 coupled to an instruction cache unit 934, which is coupled to an instruction translation lookaside buffer (TLB) 936, which is coupled to an instruction fetch unit 938, which is coupled to a decode unit 940. The decode unit 940 (or decoder) may decode instructions, and generate as an output one or more micro-operations, micro-code entry points, microinstructions, other instructions, or other control signals, which are decoded from, or which otherwise reflect, or are derived from, the original instructions. The decode unit 940 may be implemented using various different mechanisms. Examples of suitable mechanisms include, but are not limited to, look-up tables, hardware implementations, programmable logic arrays (PLAs), microcode read only memories (ROMs), etc. In one embodiment, the core 990 includes a microcode ROM or other medium that stores microcode for certain macroinstructions (e.g., in decode unit 940 or otherwise within the front end unit 930). The decode unit 940 is coupled to a rename/allocator unit 952 in the execution engine unit 950.

The execution engine unit 950 includes the rename/ allocator unit 952 coupled to a retirement unit 954 and a set of one or more scheduler unit(s) 956. The scheduler unit(s) 956 represents any number of different schedulers, including reservations stations, central instruction window, etc. The scheduler unit(s) 956 is coupled to the physical register file(s) unit(s) 958. Each of the physical register file(s) units 958 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 958 comprises a vector registers unit, a write mask registers unit, and a scalar registers unit. These register units may provide architectural vector registers, vector mask registers, and general purpose registers. The physical register file(s) unit(s) 958 is overlapped by the retirement unit 954 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 954 and the physical register file(s) unit(s) 958 are coupled to the execution cluster(s) 960. The execution cluster(s) 960 includes a set of one or more execution units 962 and a set of one or more memory access units 964. The execution units 962 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 956, physical register file(s) unit(s) 958, and execution cluster(s) 960 are shown as being possibly plural because certain embodiments create separate pipelines for certain types of data/operations (e.g., a scalar integer pipeline, a scalar floating point/packed integer/packed floating point/ vector integer/vector floating point pipeline, and/or a memory access pipeline that each have their own scheduler unit, physical register file(s) unit, and/or execution cluster— and in the case of a separate memory access pipeline, certain embodiments are implemented in which only the execution cluster of this pipeline has the memory access unit(s) 964). It should also be understood that where separate pipelines are used, one or more of these pipelines may be out-of-order issue/execution and the rest in-order.

The set of memory access units 964 is coupled to the memory unit 970, which includes a data TLB unit 972 coupled to a data cache unit 974 coupled to a level 2 (L2) cache unit 976. In one exemplary embodiment, the memory access units 964 may include a load unit, a store address unit, and a store data unit, each of which is coupled to the data TLB unit 972 in the memory unit 970. The instruction cache unit 934 is further coupled to a level 2 (L2) cache unit 976 in the memory unit 970. The L2 cache unit 976 is coupled to one or more other levels of cache and eventually to a main memory.

By way of example, the exemplary register renaming, out-of-order issue/execution core architecture may implement the pipeline 900 as follows: 1) the instruction fetch 938 performs the fetch and length decoding stages 902 and 904; 2) the decode unit 940 performs the decode stage 906; 3) the rename/allocator unit 952 performs the allocation stage 908 and renaming stage 910; 4) the scheduler unit(s) 956 performs the schedule stage 912; 5) the physical register file(s) unit(s) 958 and the memory unit 970 perform the register read/memory read stage 914; the execution cluster 960 perform the execute stage 916; 6) the memory unit 970 and the physical register file(s) unit(s) 958 perform the write back/memory write stage 918; 7) various units may be involved in the exception handling stage 922; and 8) the retirement unit 954 and the physical register file(s) unit(s) 958 perform the commit stage 924.

The core 990 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 990 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 934/974 and a shared L2 cache unit 976, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Figure 10B:
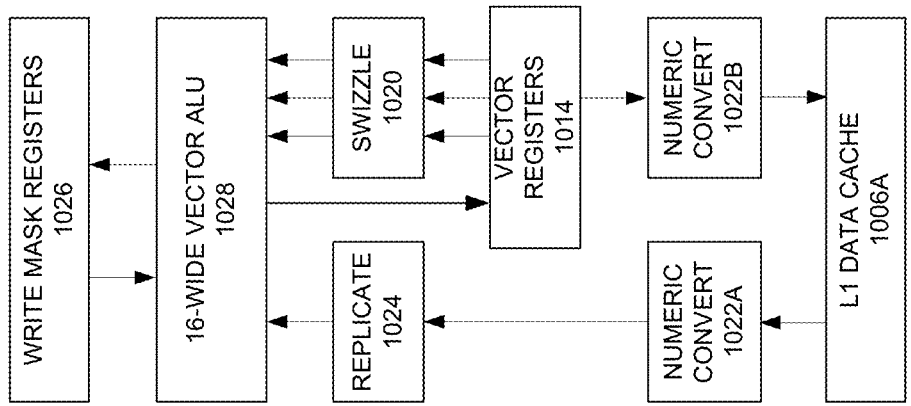
FIGS. 10A-B illustrate a block diagram of a more specific exemplary in-order core architecture, which core would be one of several logic blocks (potentially including other cores of the same type and/or different types) in a chip in accordance with certain embodiments.
Figure 10A:
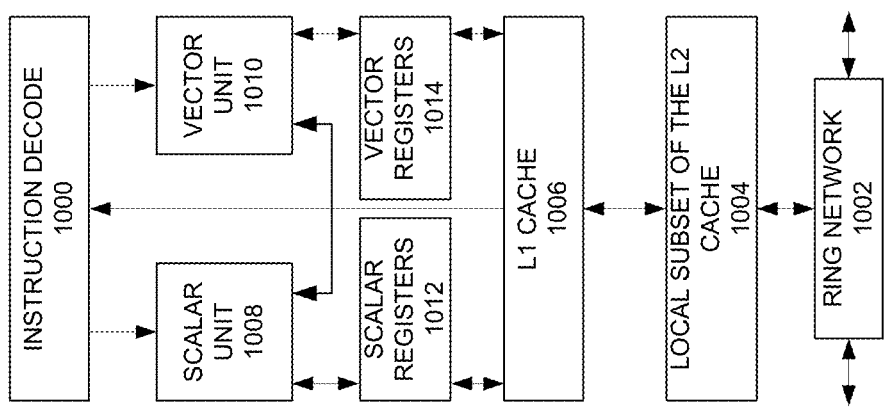

FIGS. 10A-B illustrate a block diagram of a more specific exemplary in-order core architecture, which core would be one of several logic blocks (potentially including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 10A is a block diagram of a single processor core, along with its connection to the on-die interconnect network 1002 and with its local subset of the Level 2 (L2) cache 1004, according to various embodiments. In one embodiment, an instruction decoder 1000 supports the x86 instruction set with a packed data instruction set extension. An L1 cache 1006 allows low-latency accesses to cache memory into the scalar and vector units. While in one embodiment (to simplify the design), a scalar unit 1008 and a vector unit 1010 use separate register sets (respectively, scalar registers 1012 and vector registers 1014) and data transferred between them is written to memory and then read back in from a level 1 (L1) cache 1006, alternative embodiments may use a different approach (e.g., use a single register set or include a communication path that allow data to be transferred between the two register files without being written and read back).

The local subset of the L2 cache 1004 is part of a global L2 cache that is divided into separate local subsets (in some embodiments one per processor core). Each processor core has a direct access path to its own local subset of the L2 cache 1004. Data read by a processor core is stored in its L2 cache subset 1004 and can be accessed quickly, in parallel with other processor cores accessing their own local L2 cache subsets. Data written by a processor core is stored in its own L2 cache subset 1004 and is flushed from other subsets, if necessary. The ring network ensures coherency for shared data. The ring network is bi-directional to allow agents such as processor cores, L2 caches and other logic blocks to communicate with each other within the chip. In a particular embodiment, each ring data-path is 1012-bits wide per direction.

FIG. 10B is an expanded view of part of the processor core in FIG. 10A according to embodiments. FIG. 10B includes an L1 data cache 1006A (part of the L1 cache 1006), as well as more detail regarding the vector unit 1010 and the vector registers 1014. Specifically, the vector unit 1010 is a 16-wide vector processing unit (VPU) (see the 16-wide ALU 1028), which executes one or more of integer, single-precision float, and double-precision float instructions. The VPU supports swizzling the register inputs with swizzle unit 1020, numeric conversion with numeric convert units 1022A-B, and replication with replication unit 1024 on the memory input. Write mask registers 1026 allow predicating resulting vector writes.

Figure 11:
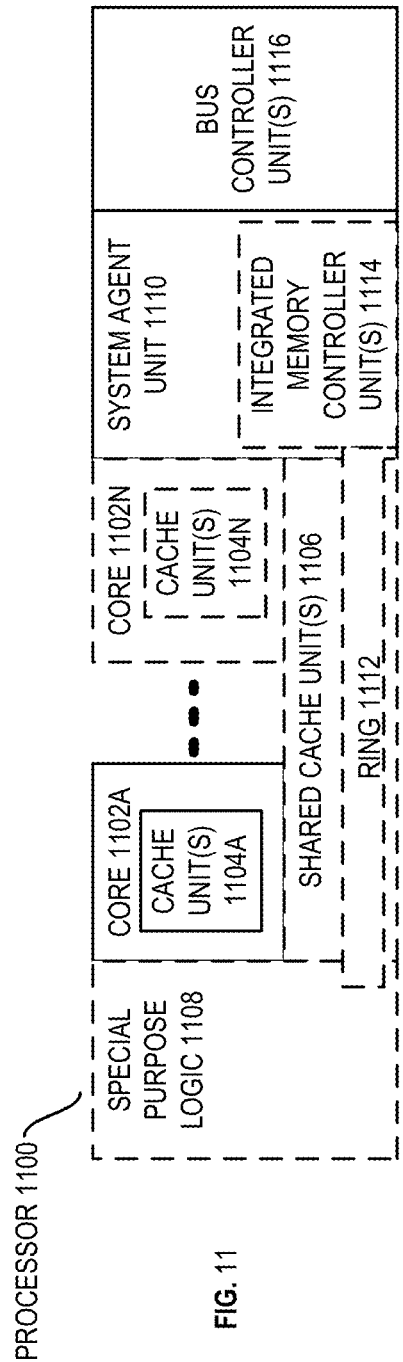
FIG. 11 is a block diagram of a processor that may have more than one core, may have an integrated memory controller, and may have integrated graphics in accordance with certain embodiments.

FIG. 11 is a block diagram of a processor 1100 that may have more than one core, may have an integrated memory controller, and may have integrated graphics according to various embodiments. The solid lined boxes in FIG. 11 illustrate a processor 1100 with a single core 1102A, a system agent 1110, and a set of one or more bus controller units 1116; while the optional addition of the dashed lined boxes illustrates an alternative processor 1100 with multiple cores 1102A-N, a set of one or more integrated memory controller unit(s) 1114 in the system agent unit 1110, and special purpose logic 1108.

Thus, different implementations of the processor 1100 may include: 1) a CPU with the special purpose logic 1108 being integrated graphics and/or scientific (throughput) logic (which may include one or more cores), and the cores 1102A-N being one or more general purpose cores (e.g., general purpose in-order cores, general purpose out-of-order cores, or a combination of the two); 2) a coprocessor with the cores 1102A-N being a large number of special purpose cores intended primarily for graphics and/or scientific (throughput); and 3) a coprocessor with the cores 1102A-N being a large number of general purpose in-order cores. Thus, the processor 1100 may be a general-purpose processor, coprocessor or special-purpose processor, such as, for example, a network or communication processor, compression and/or decompression engine, graphics processor, GPGPU (general purpose graphics processing unit), a high-throughput many integrated core (MIC) coprocessor (e.g., including 30 or more cores), embedded processor, or other fixed or configurable logic that performs logical operations. The processor may be implemented on one or more chips. The processor 1100 may be a part of and/or may be implemented on one or more substrates using any of a number of process technologies, such as, for example, BiCMOS, CMOS, or NMOS.

In various embodiments, a processor may include any number of processing elements that may be symmetric or asymmetric. In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

The memory hierarchy includes one or more levels of cache within the cores, a set or one or more shared cache units 1106, and external memory (not shown) coupled to the set of integrated memory controller units 1114. The set of shared cache units 1106 may include one or more mid-level caches, such as level 2 (L2), level 3 (L3), level 4 (L4), or other levels of cache, a last level cache (LLC), and/or combinations thereof. While in one embodiment a ring based interconnect unit 1112 interconnects the special purpose logic (e.g., integrated graphics logic) 1108, the set of shared cache units 1106, and the system agent unit 1110/integrated memory controller unit(s) 1114, alternative embodiments may use any number of well-known techniques for interconnecting such units. In one embodiment, coherency is maintained between one or more cache units 1106 and cores 1102A-N.

In some embodiments, one or more of the cores 1102A-N are capable of multi-threading. The system agent 1110 includes those components coordinating and operating cores 1102A-N. The system agent unit 1110 may include for example a power control unit (PCU) and a display unit. The PCU may be or include logic and components needed for regulating the power state of the cores 1102A-N and the special purpose logic 1108. The display unit is for driving one or more externally connected displays.

The cores 1102A-N may be homogenous or heterogeneous in terms of architecture instruction set; that is, two or more of the cores 1102A-N may be capable of executing the same instruction set, while others may be capable of executing only a subset of that instruction set or a different instruction set.

FIGS. 12-15 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable for performing the methods described in this disclosure. In general, a huge variety of systems or electronic devices capable of incorporating a processor and/or other execution logic as disclosed herein are generally suitable.

Figure 12:
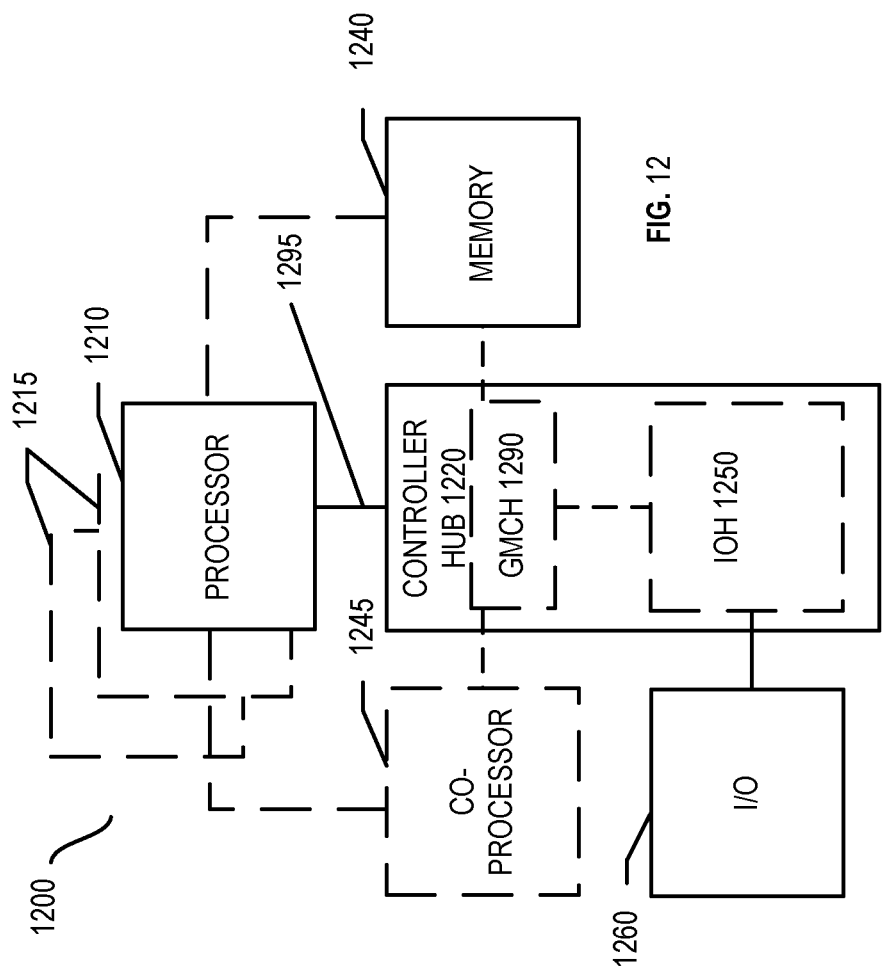
FIGS. 12, 13, 14, and 15 are block diagrams of exemplary computer architectures in accordance with certain embodiments.

FIG. 12 depicts a block diagram of a system 1200 in accordance with one embodiment of the present disclosure. The system 1200 may include one or more processors 1210, 1215, which are coupled to a controller hub 1220. In one embodiment the controller hub 1220 includes a graphics memory controller hub (GMCH) 1290 and an Input/Output Hub (IOH) 1250 (which may be on separate chips or the same chip); the GMCH 1290 includes memory and graphics controllers coupled to memory 1240 and a coprocessor 1245; the IOH 1250 couples input/output (I/O) devices 1260 to the GMCH 1290. Alternatively, one or both of the memory and graphics controllers are integrated within the processor (as described herein), the memory 1240 and the coprocessor 1245 are coupled directly to the processor 1210, and the controller hub 1220 is a single chip comprising the IOH 1250.

The optional nature of additional processors 1215 is denoted in FIG. 12 with broken lines. Each processor 1210, 1215 may include one or more of the processing cores described herein and may be some version of the processor 1100.

The memory 1240 may be, for example, dynamic random access memory (DRAM), phase change memory (PCM), other suitable memory, or any combination thereof. The memory 1240 may store any suitable data, such as data used by processors 1210, 1215 to provide the functionality of computer system 1200. For example, data associated with programs that are executed or files accessed by processors 1210, 1215 may be stored in memory 1240. In various embodiments, memory 1240 may store data and/or sequences of instructions that are used or executed by processors 1210, 1215.

In at least one embodiment, the controller hub 1220 communicates with the processor(s) 1210, 1215 via a multi-drop bus, such as a frontside bus (FSB), point-to-point interface such as QuickPath Interconnect (QPI), or similar connection 1295.

In one embodiment, the coprocessor 1245 is a special-purpose processor, such as, for example, a high-throughput MIC processor, a network or communication processor, compression and/or decompression engine, graphics processor, GPGPU, embedded processor, or the like. In one embodiment, controller hub 1220 may include an integrated graphics accelerator.

There can be a variety of differences between the physical resources 1210, 1215 in terms of a spectrum of metrics of merit including architectural, microarchitectural, thermal, power consumption characteristics, and the like.

In one embodiment, the processor 1210 executes instructions that control data processing operations of a general type. Embedded within the instructions may be coprocessor instructions. The processor 1210 recognizes these coprocessor instructions as being of a type that should be executed by the attached coprocessor 1245. Accordingly, the processor 1210 issues these coprocessor instructions (or control signals representing coprocessor instructions) on a coprocessor bus or other interconnect, to coprocessor 1245. Coprocessor(s) 1245 accept and execute the received coprocessor instructions.

Figure 13:
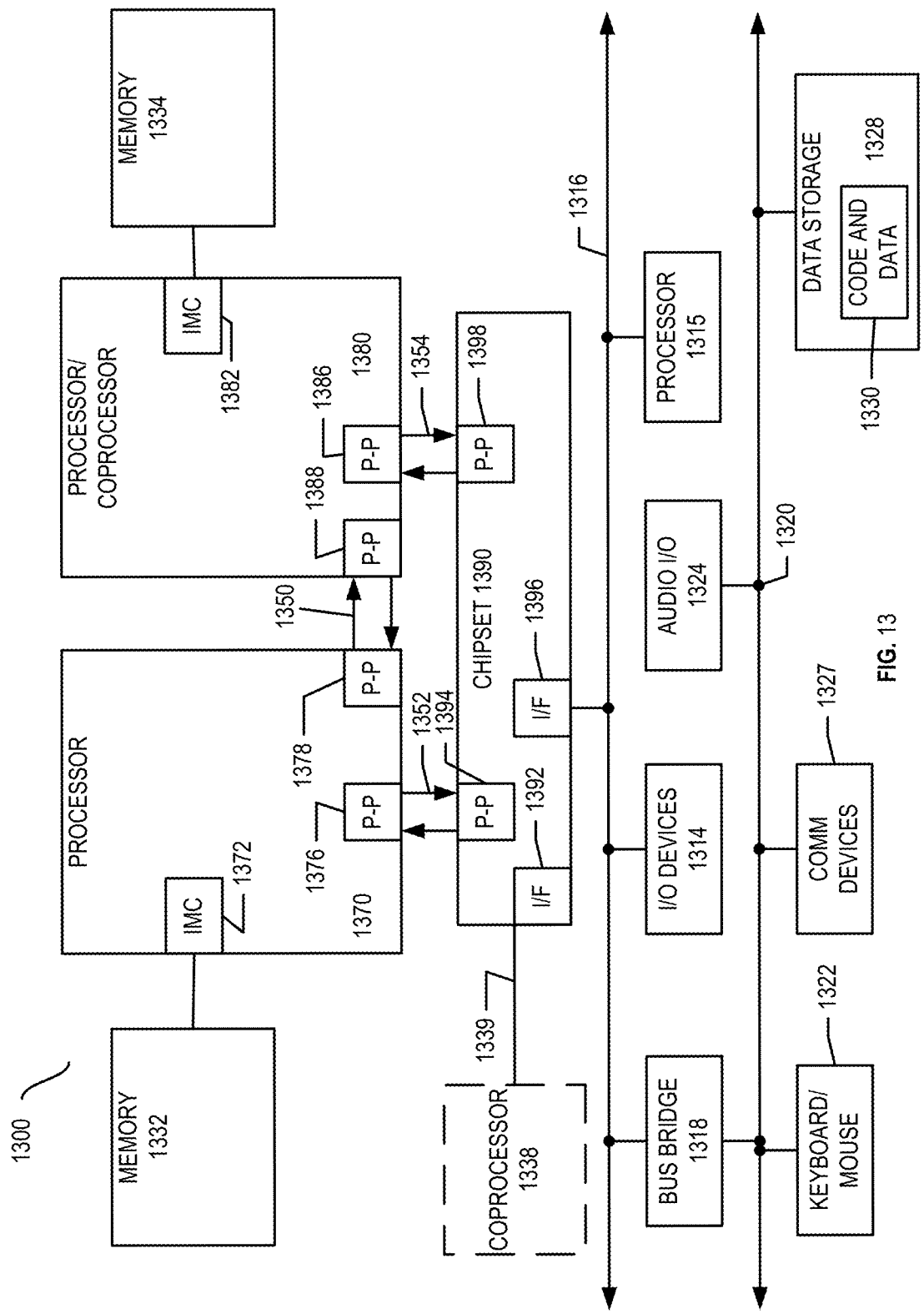

FIG. 13 depicts a block diagram of a first more specific exemplary system 1300 in accordance with an embodiment of the present disclosure. As shown in FIG. 13, multiprocessor system 1300 is a point-to-point interconnect system, and includes a first processor 1370 and a second processor 1380 coupled via a point-to-point interconnect 1350. Each of processors 1370 and 1380 may be some version of the processor 1100. In one embodiment of the disclosure, processors 1370 and 1380 are respectively processors 1210 and 1215, while coprocessor 1338 is coprocessor 1245. In another embodiment, processors 1370 and 1380 are respectively processor 1210 and coprocessor 1245.

Processors 1370 and 1380 are shown including integrated memory controller (IMC) units 1372 and 1382, respectively. Processor 1370 also includes as part of its bus controller units point-to-point (P-P) interfaces 1376 and 1378; similarly, second processor 1380 includes P-P interfaces 1386 and 1388. Processors 1370, 1380 may exchange information via a point-to-point (P-P) interface 1350 using P-P interface circuits 1378, 1388. As shown in FIG. 13, IMCs 1372 and 1382 couple the processors to respective memories, namely a memory 1332 and a memory 1334, which may be portions of main memory locally attached to the respective processors.

Processors 1370, 1380 may each exchange information with a chipset 1390 via individual P-P interfaces 1352, 1354 using point to point interface circuits 1376, 1394, 1386, 1398. Chipset 1390 may optionally exchange information with the coprocessor 1338 via a high-performance interface 1339. In one embodiment, the coprocessor 1338 is a special-purpose processor, such as, for example, a high-throughput MIC processor, a network or communication processor, compression and/or decompression engine, graphics processor, GPGPU, embedded processor, or the like.

A shared cache (not shown) may be included in either processor or outside of both processors, yet connected with the processors via a P-P interconnect, such that either or both processors' local cache information may be stored in the shared cache if a processor is placed into a low power mode.

Chipset 1390 may be coupled to a first bus 1316 via an interface 1396. In one embodiment, first bus 1316 may be a Peripheral Component Interconnect (PCI) bus, or a bus such as a PCI Express bus or another third generation I/O interconnect bus, although the scope of the present disclosure is not so limited.

As shown in FIG. 13, various I/O devices 1314 may be coupled to first bus 1316, along with a bus bridge 1318 which couples first bus 1316 to a second bus 1320. In one embodiment, one or more additional processor(s) 1315, such as coprocessors, high-throughput MIC processors, GPGPU's, accelerators (such as, e.g., graphics accelerators or digital signal processing (DSP) units), field programmable gate arrays, or any other processor, are coupled to first bus 1316. In one embodiment, second bus 1320 may be a low pin count (LPC) bus. Various devices may be coupled to a second bus 1320 including, for example, a keyboard and/or mouse 1322, communication devices 1327 and a storage unit 1328 such as a disk drive or other mass storage device which may include instructions/code and data 1330, in one embodiment. Further, an audio I/O 1324 may be coupled to the second bus 1320. Note that other architectures are contemplated by this disclosure. For example, instead of the point-to-point architecture of FIG. 13, a system may implement a multi-drop bus or other such architecture.

Figure 14:
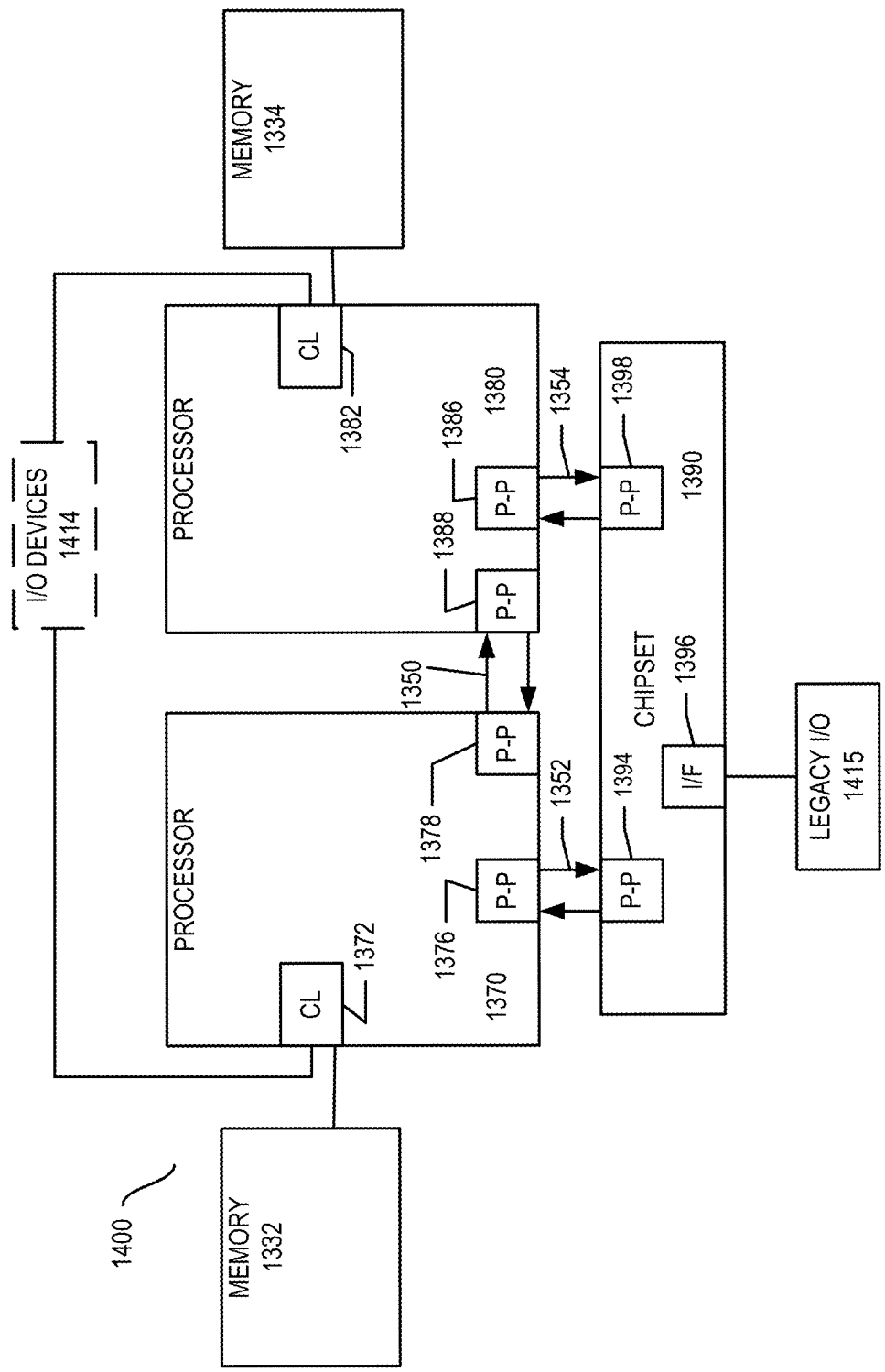

FIG. 14 depicts a block diagram of a second more specific exemplary system 1400 in accordance with an embodiment of the present disclosure. Similar elements in FIGS. 13 and 14 bear similar reference numerals, and certain aspects of FIG. 13 have been omitted from FIG. 14 in order to avoid obscuring other aspects of FIG. 14.

FIG. 14 illustrates that the processors 1370, 1380 may include integrated memory and I/O control logic ("CL") 1372 and 1382, respectively. Thus, the CL 1372, 1382 include integrated memory controller units and include I/O control logic. FIG. 14 illustrates that not only are the memories 1332, 1334 coupled to the CL 1372, 1382, but also that I/O devices 1414 are also coupled to the control logic 1372, 1382. Legacy I/O devices 1415 are coupled to the chipset 1390.

Figure 15:
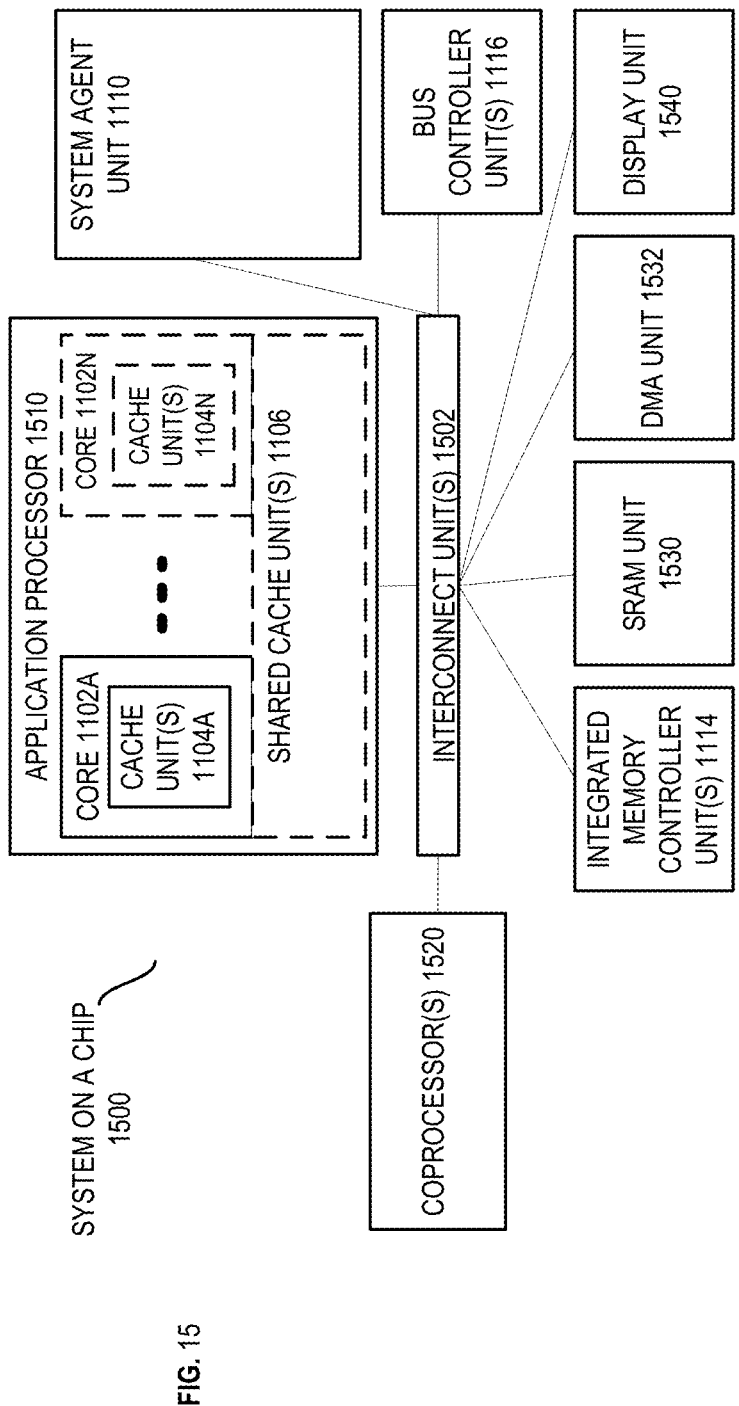

FIG. 15 depicts a block diagram of a SoC 1500 in accordance with an embodiment of the present disclosure. Similar elements in FIG. 11 bear similar reference numerals. Also, dashed lined boxes are optional features on more advanced SoCs. In FIG. 15, an interconnect unit(s) 1502 is coupled to: an application processor 1510 which includes a set of one or more cores 202A-N and shared cache unit(s) 1106; a system agent unit 1110; a bus controller unit(s) 1116; an integrated memory controller unit(s) 1114; a set or one or more coprocessors 1520 which may include integrated graphics logic, an image processor, an audio processor, and a video processor; an static random access memory (SRAM) unit 1530; a direct memory access (DMA) unit 1532; and a display unit 1540 for coupling to one or more external displays. In one embodiment, the coprocessor(s) 1520 include a special-purpose processor, such as, for example, a network or communication processor, compression and/or decompression engine, GPGPU, a high-throughput MIC processor, embedded processor, or the like.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 16:
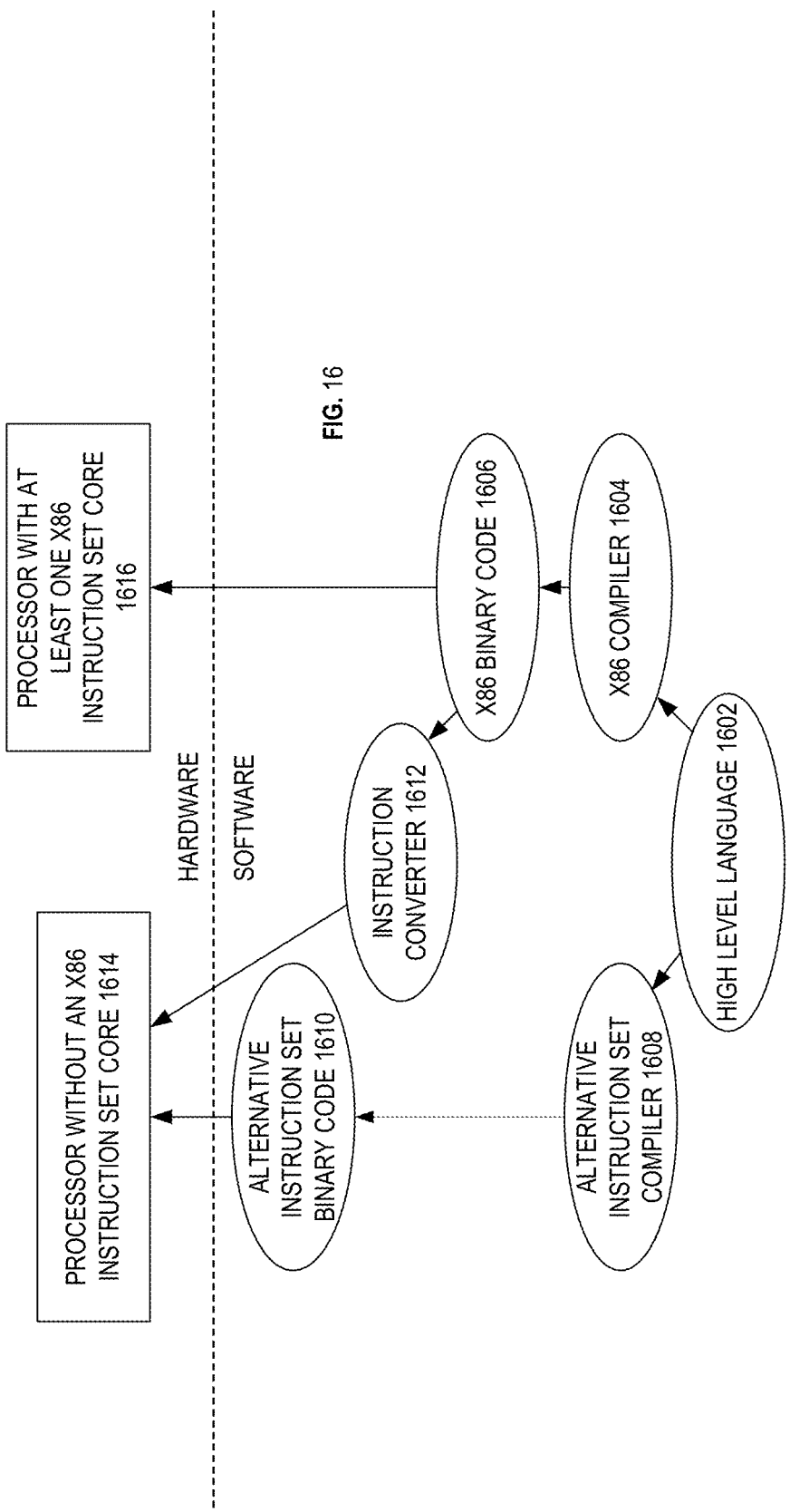
FIG. 16 is a block diagram contrasting the use of a software instruction converter to convert binary instructions in a source instruction set to binary instructions in a target instruction set in accordance with certain embodiments.

FIG. 16 is a block diagram contrasting the use of a software instruction converter to convert binary instructions in a source instruction set to binary instructions in a target instruction set according to embodiments of the disclosure. In the illustrated embodiment, the instruction converter is a software instruction converter, although alternatively the instruction converter may be implemented in software, firmware, hardware, or various combinations thereof. FIG. 16 shows a program in a high level language 1602 may be compiled using an x86 compiler 1604 to generate x86 binary code 1606 that may be natively executed by a processor with at least one x86 instruction set core 1616. The processor with at least one x86 instruction set core 1616 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1604 represents a compiler that is operable to generate x86 binary code 1606 (e.g., object code) that can, with or without additional linkage processing, be executed on the processor with at least one x86 instruction set core 1616. Similarly, FIG. 16 shows the program in the high level language 1602 may be compiled using an alternative instruction set compiler 1608 to generate alternative instruction set binary code 1610 that may be natively executed by a processor without at least one x86 instruction set core 1614 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1612 is used to convert the x86 binary code 1606 into code that may be natively executed by the processor without an x86 instruction set core 1614. This converted code is not likely to be the same as the alternative instruction set binary code 1610 because an instruction converter capable of this is difficult to make; however, the converted code will accomplish the general operation and be made up of instructions from the alternative instruction set. Thus, the instruction converter 1612 represents software, firmware, hardware, or a combination thereof that, through emulation, simulation or any other process, allows a processor or other electronic device that does not have an x86 instruction set processor or core to execute the x86 binary code 1606.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the manufacture of the described hardware.

In any representation of the design, the data representing the design may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

In various embodiments, a medium storing a representation of the design may be provided to a manufacturing system (e.g., a semiconductor manufacturing system capable of manufacturing an integrated circuit and/or related components). The design representation may instruct the system to manufacture a device capable of performing any combination of the functions described above. For example, the design representation may instruct the system regarding which components to manufacture, how the components should be coupled together, where the components should be placed on the device, and/or regarding other suitable specifications regarding the device to be manufactured.

Thus, one or more aspects of at least one embodiment may be implemented by representative instructions stored on a machine-readable medium which represents various logic within the processor, which when read by a machine causes the machine to fabricate logic to perform the techniques described herein. Such representations, often referred to as "IP cores" may be stored on a non-transitory tangible machine readable medium and supplied to various customers or manufacturing facilities to load into the fabrication machines that manufacture the logic or processor.

Embodiments of the mechanisms disclosed herein may be implemented in hardware, software, firmware, or a combination of such implementation approaches. Embodiments of the disclosure may be implemented as computer programs or program code executing on programmable systems comprising at least one processor, a storage system (including volatile and non-volatile memory and/or storage elements), at least one input device, and at least one output device.

Program code, such as code 1330 illustrated in FIG. 13, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In various embodiments, the language may be a compiled or interpreted language.

The embodiments of methods, hardware, software, firmware or code set forth above may be implemented via instructions or code stored on a machine-accessible, machine readable, computer accessible, or computer readable medium which are executable (or otherwise accessible) by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information therefrom.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Logic may be used to implement any of the functionality of the various components such as processor 100, decompression engine 104, code table update logic 106, code length count table 108, code population table 110, cumulative code index table 112, decoder 114, codes tables 116 and 118, padding logic 404, comparison logic 406, comparison logic 504, critical port 508, non-critical port 510, FPGA 800, other component described herein, or any subcomponent of any of these components. "Logic" may refer to hardware, firmware, software and/or combinations of each to perform one or more functions. As an example, logic may include hardware, such as a micro-controller or processor, associated with a non-transitory medium to store code adapted to be executed by the micro-controller or processor. Therefore, reference to logic, in one embodiment, refers to the hardware, which is specifically configured to recognize and/or execute the code to be held on a non-transitory medium. Furthermore, in another embodiment, use of logic refers to the non-transitory medium including the code, which is specifically adapted to be executed by the microcontroller to perform predetermined operations. And as can be inferred, in yet another embodiment, the term logic (in this example) may refer to the combination of the hardware and the non-transitory medium. In various embodiments, logic may include a microprocessor or other processing element operable to execute software instructions, discrete logic such as an application specific integrated circuit (ASIC), a programmed logic device such as a field programmable gate array (FPGA), a memory device containing instructions, combinations of logic devices (e.g., as would be found on a printed circuit board), or other suitable hardware and/or software. Logic may include one or more gates or other circuit components, which may be implemented by, e.g., transistors. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices. Often, logic boundaries that are illustrated as separate commonly vary and potentially overlap. For example, first and second logic may share hardware, software, firmware, or a combination thereof, while potentially retaining some independent hardware, software, or firmware.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

In at least one embodiment, an apparatus comprises a decompression engine to determine a plurality of tokens used to encode a block of data; populate a lookup table with at least two of the tokens in order of increasing token length; disable a first portion of the lookup table and enable a second portion of the lookup table based on a value of a payload of the block of data; and search for a match between a token and the payload in the second portion of the lookup table.

In an embodiment, the lookup table comprises a content addressable memory (CAM), the first portion of the lookup table comprises a first bank of the CAM, and the second portion comprises a second bank of the CAM. In an embodiment, the decompression engine is to compare the payload against a last token of the second portion of the lookup table to determine whether to enable the second portion of the lookup table. In an embodiment, the tokens are ordered by increasing numeric value in the lookup table. In an embodiment, the decompression engine is to populate a first table comprising entries for each token length specified by a header associated with the block of data, wherein a first entry of the first table corresponds to a first token length and comprises an address of the lookup table at which a token of the first token length is to be stored. In an embodiment, the decompression engine is to identify a token length in the header; based on a determination that the identified token length is the first token length, write a token of the first token length to the lookup table at an address specified by the first entry; and update the first entry to store an address of the lookup table at which a next token of the first token length is to be placed. In an embodiment, the decompression engine is to determine a lowest valued token of a particular token length; and activate a segment of the second portion of the lookup table for use in the search for the match, the activation based on a comparison between the lowest valued token and the payload. In an embodiment, the segment of the second portion of the lookup table is to determine whether a set of least significant bits of the payload match a corresponding set of least significant bits of tokens of the second portion of the lookup table. In an embodiment, the decompression engine is to deactivate the segment of the second portion of the lookup table for use in a search for a match with a second payload in response to determination that the second payload has a numeric value that is less than a numeric value of the lowest valued token of the particular token length. In an embodiment, the apparatus further comprises a battery communicatively coupled to a processor, a display communicatively coupled to the processor, or a network interface communicatively coupled to the processor.

In at least one embodiment, a method comprises determining a plurality of tokens used to encode a block of data; populating a lookup table with at least two of the tokens in order of increasing token length; disabling a first portion of the lookup table and enable a second portion of the lookup table based on a value of a payload of the block of data; and searching for a match between a token and the payload in the second portion of the lookup table.

In an embodiment, the lookup table comprises a content addressable memory (CAM), the first portion of the lookup table comprises a first bank of the CAM, and the second portion comprises a second bank of the CAM. In an embodiment, the method further comprises comparing the payload against a last token of the second portion of the lookup table to determine whether to enable the second portion of the lookup table. In an embodiment, the tokens are ordered by increasing numeric value in the lookup table. In an embodiment, the method further comprises further comprising populating a first table comprising entries for each token length specified by a header associated with the block of data, wherein a first entry of the first table corresponds to a first token length and comprises an address of the lookup table at which a token of the first token length is to be stored. In an embodiment, the method further comprises identifying a token length in the header; based on a determination that the identified token length is the first token length, writing a token of the first token length to the lookup table at an address specified by the first entry; and updating the first entry to store an address of the lookup table at which a next token of the first token length is to be placed. In an embodiment, the method further comprises determining a lowest valued token of a particular token length; and activating a segment of the second portion of the lookup table for use in the search for the match, the activation based on a comparison between the lowest valued token and the payload. In an embodiment, the segment of the second portion of the lookup table is to determine whether a set of least significant bits of the payload match a corresponding set of least significant bits of tokens of the second portion of the lookup table. In an embodiment, the method further comprises deactivating the segment of the second portion of the lookup table for use in a search for a match with a second payload in response to determination that the second payload has a numeric value that is less than a numeric value of the lowest valued token of the particular token length. In an embodiment, the tokens are Huffman codes.

In at least one embodiment, a system comprises means for determining a plurality of tokens used to encode a block of data; means for populating a lookup table with at least two of the tokens in order of increasing token length; means for disabling a first portion of the lookup table and enable a second portion of the lookup table based on a value of a payload of the block of data; and means for searching for a match between a token and the payload in the second portion of the lookup table.

In an embodiment, the system further comprises means for comparing the payload against a last token of the second portion of the lookup table to determine whether to enable the second portion of the lookup table. In an embodiment, the tokens are ordered by increasing numeric value in the lookup table. In an embodiment, the system further comprises means for populating a first table comprising entries for each token length specified by a header associated with the block of data, wherein a first entry of the first table corresponds to a first token length and comprises an address of the lookup table at which a token of the first token length is to be stored. In an embodiment, the system further comprises means for determining a lowest valued token of a particular token length; and means for activating a segment of the second portion of the lookup table for use in the search for the match, the activation based on a comparison between the lowest valued token and the payload.

In at least one embodiment, at least one machine readable storage medium comprises instructions stored thereon, the instructions when executed by a machine to cause the machine to determine a plurality of tokens used to encode a block of data; populate a lookup table with at least two of the tokens in order of increasing token length; disable a first portion of the lookup table and enable a second portion of the lookup table based on a value of a payload of the block of data; and search for a match between a token and the payload in the second portion of the lookup table.

In an embodiment, the instructions when executed cause the machine to compare the payload against a last token of the second portion of the lookup table to determine whether to enable the second portion of the lookup table. In an embodiment, the tokens are ordered by increasing numeric value in the lookup table. In an embodiment, the instructions when executed are to cause the machine to populate a first table comprising entries for each token length specified by a header associated with the block of data, wherein a first entry of the first table corresponds to a first token length and comprises an address of the lookup table at which a token of the first token length is to be stored. In an embodiment, the instructions when executed are to cause the machine to determine a lowest valued token of a particular token length; and activate a segment of the second portion of the lookup table for use in the search for the match, the activation based on a comparison between the lowest valued token and the payload.

In an embodiment, a system comprises a processor to access data decoded from a compressed data block comprising a first plurality of tokens; and a decompression engine to determine a plurality of tokens used to encode the data block; populate a lookup table with at least two of the tokens in order of increasing token length; disable a first portion of the lookup table and enable a second portion of the lookup table based on a value of a payload of the data block; and search for a match between a token and the payload in the second portion of the lookup table.

In an embodiment, the system further comprises a battery communicatively coupled to the processor, a display communicatively coupled to the processor, or a network interface communicatively coupled to the processor.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
   a decompression engine comprising a lookup table comprising memory, the decompression engine further comprising circuitry, the decompression engine to:
   determine a plurality of tokens used to encode a block of data;
   populate the lookup table with at least two of the tokens in order of increasing token length;
   disable a first portion of the lookup table and enable a second portion of the lookup table prior to a search operation, the disabling and enabling based on a value of a payload of the block of data; and
   perform the search operation by searching for a match between a token and the payload in the second portion of the lookup table.

2. The apparatus of claim 1, wherein the lookup table comprises a content addressable memory (CAM), the first portion of the lookup table comprises a first bank of the CAM, and the second portion comprises a second bank of the CAM.

3. The apparatus of claim 1, the decompression engine to compare the payload against a last token of the second portion of the lookup table to determine whether to enable the second portion of the lookup table.

4. The apparatus of claim 1, wherein the tokens are ordered by increasing numeric value in the lookup table.

5. The apparatus of claim 1, the decompression engine to populate a first table comprising entries for each token length specified by a header associated with the block of data, wherein a first entry of the first table corresponds to a first token length and comprises an address of the lookup table at which a token of the first token length is to be stored.

6. The apparatus of claim 5, the decompression engine to:
   identify a token length in the header;
   based on a determination that the identified token length is the first token length, write a token of the first token length to the lookup table at an address specified by the first entry; and
   update the first entry to store an address of the lookup table at which a next token of the first token length is to be placed.

7. The apparatus of claim 1, the decompression engine to:
determine a lowest valued token of a particular token length; and
activate a segment of the second portion of the lookup table for use in the search for the match, the activation based on a comparison between the lowest valued token and the payload.

8. The apparatus of claim 7, wherein the segment of the second portion of the lookup table is to determine whether a set of least significant bits of the payload match a corresponding set of least significant bits of tokens of the second portion of the lookup table.

9. The apparatus of claim 7, wherein the decompression engine is to deactivate the segment of the second portion of the lookup table for use in a search for a match with a second payload in response to determination that the second payload has a numeric value that is less than a numeric value of the lowest valued token of the particular token length.

10. The apparatus of claim 1, further comprising a battery communicatively coupled to a processor, a display communicatively coupled to the processor, or a network interface communicatively coupled to the processor.

11. The apparatus of claim 1, the decompression engine to disable the first portion of the lookup table for the search operation based on a comparison between the payload and a highest valued token of the first portion of the lookup table.

12. The apparatus of claim 1, wherein the first portion of the lookup table that is disabled for the search operation comprises a first plurality of the tokens and the second portion of the lookup table that is enabled for the search operation comprises a second plurality of the tokens.

13. The apparatus of claim 1, wherein prior to disabling the first portion and enabling the second portion of the lookup table, the decompression engine is to determine which portion of the lookup table includes a code included in the payload based on a numeric value of the payload and numeric values of codes stored inside the first portion and second portion.

14. A method comprising:
determining a plurality of tokens used to encode a block of data;
populating a lookup table with at least two of the tokens in order of increasing token length;
disabling a first portion of the lookup table and enabling a second portion of the lookup table prior to a search operation, the disabling and enabling based on a value of a payload of the block of data; and
perform the search operation by searching for a match between a token and the payload in the second portion of the lookup table.

15. The method of claim 14, further comprising comparing the payload against a last token of the second portion of the lookup table to determine whether to enable the second portion of the lookup table.

16. The method of claim 14, wherein the tokens are ordered by increasing numeric value in the lookup table.

17. The method of claim 14, further comprising populating a first table comprising entries for each token length specified by a header associated with the block of data, wherein a first entry of the first table corresponds to a first token length and comprises an address of the lookup table at which a token of the first token length is to be stored.

18. The method of claim 14, further comprising:
determining a lowest valued token of a particular token length; and
activating a segment of the second portion of the lookup table for use in the search for the match, the activation based on a comparison between the lowest valued token and the payload.

19. At least one non-transitory machine readable storage medium having instructions stored thereon, the instructions when executed by a machine to cause the machine to:
determine a plurality of tokens used to encode a block of data;
populate a lookup table with at least two of the tokens in order of increasing token length;
disable a first portion of the lookup table and enable a second portion of the lookup table prior to a search operation, the disabling and enabling based on a value of a payload of the block of data; and
perform the search operation by searching for a match between a token and the payload in the second portion of the lookup table.

20. The at least one medium of claim 19, the instructions when executed to cause the machine to compare the payload against a last token of the second portion of the lookup table to determine whether to enable the second portion of the lookup table.

21. The at least one medium of claim 19, wherein the tokens are ordered by increasing numeric value in the lookup table.

22. The at least one medium of claim 19, the instructions when executed to cause the machine to populate a first table comprising entries for each token length specified by a header associated with the block of data, wherein a first entry of the first table corresponds to a first token length and comprises an address of the lookup table at which a token of the first token length is to be stored.

23. The at least one medium of claim 19, the instructions when executed to cause the machine to:
determine a lowest valued token of a particular token length; and
activate a segment of the second portion of the lookup table for use in the search for the match, the activation based on a comparison between the lowest valued token and the payload.

* * * * *